US009466668B2

(12) United States Patent
Colinge et al.

(10) Patent No.: US 9,466,668 B2
(45) Date of Patent: Oct. 11, 2016

(54) INDUCING LOCALIZED STRAIN IN VERTICAL NANOWIRE TRANSISTORS

(71) Applicant: Taiwan Semiconductor Manufacturing Company, Ltd., Hsin-Chu (TW)

(72) Inventors: Jean-Pierre Colinge, Hsin-Chu (TW); Gwan Sin Chang, Hsin-Chu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/599,247

(22) Filed: Jan. 16, 2015

(65) Prior Publication Data
US 2015/0129831 A1 May 14, 2015

Related U.S. Application Data

(63) Continuation-in-part of application No. 13/763,110, filed on Feb. 8, 2013, now Pat. No. 9,368,619.

(51) Int. Cl.
*H01L 29/06* (2006.01)
*H01L 29/10* (2006.01)
*H01L 29/78* (2006.01)

(52) U.S. Cl.
CPC ....... *H01L 29/0676* (2013.01); *H01L 29/1033* (2013.01); *H01L 29/7827* (2013.01); *H01L 29/7843* (2013.01)

(58) Field of Classification Search
CPC ............. H01L 29/0676; H01L 29/456; H01L 29/775; H01L 29/0692; H01L 29/4933; H01L 29/1054; H01L 29/517; H01L 29/6656; H01L 29/6659; H01L 29/7833; H01L 29/0673; H01L 29/7842; H01L 29/7843; H01L 29/7846
USPC .................................. 257/324, 321, 319, 314
See application file for complete search history.

(56) References Cited

U.S. PATENT DOCUMENTS 7,667,271 B2   2/2010   Yu et al.
7,759,729 B2   7/2010   Bjoerk et al.
(Continued)

FOREIGN PATENT DOCUMENTS

JP    2009239167    10/2009
KR    20060012724   2/2006
(Continued)

OTHER PUBLICATIONS

Larrieu et al. "Vertical NW array-based FETs for ultimate scaling," RSC Nanoscale, 2013, 5, 2437-2441; Jan. 21, 2013.*
(Continued)

*Primary Examiner* — Kenneth Parker
*Assistant Examiner* — Bo Fan
(74) *Attorney, Agent, or Firm* — Slater Matsil, LLP

(57) ABSTRACT

A device includes a semiconductor substrate and a vertical nano-wire over the semiconductor substrate. The vertical nano-wire includes a bottom source/drain region, a channel region over the bottom source/drain region, and a top source/drain region over the channel region. A top Inter-Layer Dielectric (ILD) encircles the top source/drain region. The device further includes a bottom ILD encircling the bottom source/drain region, a gate electrode encircling the channel region, and a strain-applying layer having vertical portions on opposite sides of, and contacting opposite sidewalls of, the top ILD, the bottom ILD, and the gate electrode.

20 Claims, 29 Drawing Sheets

(56) References Cited

U.S. PATENT DOCUMENTS

| | | | |
|---|---|---|---|
| 8,076,231 B2* | 12/2011 | Saitoh | H01L 21/823821 257/347 |
| 8,164,146 B2* | 4/2012 | Lung | B82Y 10/00 257/413 |
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,772,771 B2 | 7/2014 | Tanaka | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 2005/0227425 A1 | 10/2005 | Henley | |
| 2005/0255667 A1* | 11/2005 | Arghavani | H01L 29/6656 438/405 |
| 2007/0082448 A1 | 4/2007 | Kim et al. | |
| 2007/0284623 A1 | 12/2007 | Kim et al. | |
| 2008/0197418 A1 | 8/2008 | Parthasarathy et al. | |
| 2009/0020764 A1 | 1/2009 | Anderson et al. | |
| 2009/0242990 A1 | 10/2009 | Saitoh et al. | |
| 2010/0019276 A1 | 1/2010 | Jang | |
| 2010/0176459 A1 | 7/2010 | Wernersson et al. | |
| 2010/0210096 A1 | 8/2010 | Masuoka et al. | |
| 2010/0301402 A1 | 12/2010 | Masuoka et al. | |
| 2011/0068407 A1 | 3/2011 | Yeh et al. | |
| 2011/0294295 A1 | 12/2011 | Zhu et al. | |
| 2011/0303985 A1 | 12/2011 | Masuoka et al. | |
| 2012/0018704 A1 | 1/2012 | Wallis et al. | |
| 2012/0025169 A1 | 2/2012 | Mars et al. | |
| 2012/0061838 A1 | 3/2012 | Edelstein et al. | |
| 2012/0223288 A1* | 9/2012 | Kim | B82Y 10/00 257/9 |
| 2012/0295074 A1 | 11/2012 | Yi et al. | |
| 2013/0011983 A1 | 1/2013 | Tsai et al. | |
| 2013/0341702 A1 | 12/2013 | Kar et al. | |
| 2014/0166981 A1 | 6/2014 | Doyle et al. | |
| 2014/0252412 A1 | 9/2014 | Tsai et al. | |
| 2014/0332859 A1 | 11/2014 | Colinge et al. | |

FOREIGN PATENT DOCUMENTS

| | | |
|---|---|---|
| KR | 100712552 B2 | 4/2007 |
| KR | 100771871 | 11/2007 |

OTHER PUBLICATIONS

Lee et al. "The Effects of Texture and Doping on the Young's Modulus of Polysilicon," Mat. Res. Soc. Symp. Proc. vol. 518, 1998 Materials Research Society pp. 21-22.*

Antcliffe, G.A., et al., "Band Structure of Doped Bismuth Using the Shubnikov-de Haas Effect," Physics Review, vol. 160, No. 3, Aug. 15, 1967, pp. 531-537.

Baek, C.-K., et al., "Characteristics of Gate-all-Around Silicon Nanowire Field Effect Transistors with Asymmetric Channel Width and Source/Drain Doping Concentration," Journal of Applied Physics 112, Aug. 13, 2012, pp. 034513-1-034513-5.

Indal, A., et al. "Exploratory Study on Power-Efficient Silicon Nano-Wire Dynamic NMOSFET/PMESFET Logic" IET Sci. Meas. Technol. 2007, vol. 1, No. 2, 2007, pp. 121-130.

Bindal, A., et al. "The Design of DualWork Function CMOS Transistors and Circuits Using Silicon Nanowire Technology" IEEE Transactions on Nanotechnology, May 2007, vol. 6, No. 3, pp. 291-302.

Li, C., et al., "Bismuth nano-droplets for group-V based molecular-beam droplet epitaxy," AIP Applied Physics Letters, Applied Physics Letters 99, (2011) pp. 243113-1-243113-3.

Dresselhaus, M.S., et al., "Carbon Nanotubes and Bismuth Nanowires," Chapter 3, Nanoengineering of Structural, Functional and Smart Materials, M.J. Schulz, A.D. Kelkar and M.J. Sundaresan Eds, CRC Press, Taylor and Francis Group (2005), 41 pages.

Gundapaneni, et al., "Enhanced Electrostatic Integrity of Short-Channel Junctionless Transistor With High-K Spacers," IEEE Electron Device Letters, vol. 32, No. 10, Oct. 2011, pp. 1325-1327.

Hamedi-Hagh, S., et al. "Design of Next Generation Amplifiers Using Nanowire FETs," Journal of Electrical Engineering & Technology 2008, vol. 3, No. 4, pp. 566-570.

Hamedi-Hagh, S., et al., "Spice Modeling of Silicon Nanowire Field-Effect Transistors for High-Speed Analog Integrated Circuits," IEEE Transactions on Nanotechnology vol. 7 No .6, Nov. 2008, pp. 766-775.

Jin, S., et al., "A three-dimensional simulation of quantum transport in silicon nanowire transistor in the presence of electron-phonon interactions," Journal of Applied Physics 99, 2006, pp. 123719-1-123719-10.

Li, L., et al., "A route to fabricate single crystalline bismuth nanowire arrays with different diameters," Chemical Physics Letters, 378 (2003), pp. 244-249.

Li, L. et al., "Synthetic control of large-area, ordered bismuth nanowire arrays," Science Direct, Materials Letters 59 (2005), pp. 1223-1226.

Lee, S., "Direct observation of the semimetal-to-semiconductor transition of individual single-crystal bismuth nanowires grown by on-film formation of nanowires," IOP Publishing, Nanotechnology, 21 (2010) 405701, pp. 1-6.

Lee, et al., "Short-Channel Junctionless Nanowire Transistors", 2010, http://www.sinano.eu/data/document/latenews.pdf, 2 pages.

Lee, et al., "Performance estimation of junctionless multigate transistors", Solid-State Electronics, vol. 54, Issue 2, Feb. 2010, pp. 97-103.

Limmer, S., "Recrystallized Arrays of Bismuth Nanowires with Trigonal Orientation," Nano Letters, 2014, vol. 14, pp. 1927-1931.

Lin, Y-M., et al, "Transport properties of Bi nanowire arrays," Applied Physics Letters, vol. 76, No. 26, Jun. 26, 2000, pp. 3944-3946.

Partin, D.L., et al., "Growth and characterization of epitaxial bismuth films," Physical Review B, vol. 38, No. 6, Aug. 15, 1988, pp. 3818-3825.

Peng, Y., et al., "Bismuth quantum-wires arrays fabricated by electrodeposition in nanoporous anodic aluminum oxide and its structural properties," Materials Science and Engineering B77 (2000), pp. 246-249.

Sakui, K., et al., "A new vertical MOSFET Vertical Logic Circuit (VLC) MOSFET suppressing asymmetric characteristics and realizing an ultra compact and robust logic circuit", 2009 Semiconductor Device Research Symposium (ISDRS), Dec. 9-11, 2009, 2 pages.

Sato, S., et al., "Electrical characteristics of asymmetrical silicon nanowire field-effect transistors," Applied Physics Letters 99, Dec. 2, 2011, pp. 223518-1-223518-3.

Shim, W., et al., "Shubnikov-de Haas oscillations in an individual single-crystalline bismuth nanowire grown by on-film formation of nanowires," Applied Physics Letters 95, (2009), pp. 232107-1-232107-3.

Shim, W., et al., "On-Film Formation of Bi Nanowires with Extraordinary Electron Mobility," Nano Lett., 2009, 9 (1), pp. 18-22.

Sigma-Aldrich, "Bismuth", http://www.sigmaaldrich.com/materials-science/material-science-products.html?TablePage=19927132, 1 page.

Sleight, J.W., et al. "Gate-All-Around Silicon Nanowire MOSFETs and Circuits," Device Research Conference (DRC), Jun. 21-23, 2010, pp. 269-272.

Sun, Y., et al. "Demonstration of Memory String with Stacked Junction-Less SONOS Realized on Vertical Silicon Nanowire," 2011 IEEE International Electron Devices Meeting (IEDM, Dec. 5-7, 2011, pp. 9.7.1-9.7.4.

(56) References Cited

OTHER PUBLICATIONS

Sun, Y. et al. "Junction-Less Stackable SONOS Memory Realized on Vertical-Si-Nanowire for 3-D Application," 3rd IEEE International Memory Workshop (IMW), May 22-25, 2011, pp. 1-4.

Tsai, R-W., et al., "Voltammetric study and electrodeposition of tellurium, lead, and lead telluride in room-temperature ionic liquid 1-ethyl-3-methylimidazolium tetrafluoroborate," Electrochimica Acta 137 (2014) pp. 49-56.

van Hulst, J.A., et al., "Epitaxial growth of bismuth films and bismuth-antimony heterostructures," Physical Review B, vol. 52, No. 8, Aug. 15, 1995—II, pp. 5953-5964.

Venugopalan, S., et al., "Modeling Intrinsic and Extrinsic Asymmetry of 3D Cylindrical Gate/ Gate-All-Around FETs for Circuit Simulations," 11th Annual Non-Volatile Memory Technology Symposium (NVMTS), Nov. 7-9, 2011, 4 pages.

Cea S.M et al., "Process Modeling for Advanced Device Technologies," J. Comput. Electron, vol. 13, Issue 1, pp. 18-32, Aug. 6, 2013.

Cho, H.-J. et al., "Investigation of Gate Etch Damage at Metal/ High-k Gate Dielectric Stack Through Random Telegraph Noise in Gate Edge Direct Tunneling Current," IEEE Electron Device Letters, vol. 32, No. 4, Apr. 2011, pp. 569-571.

Chu, M., et al., "Strain: A Solution for Higher Carrier Mobility in Nanoscale MOSFETs," Annual Reviews, vol. 39, May 2009, 12 pages.

Ferain, I. et al., "Multigate transistors as the future of classical metal-oxide-semiconductor field-effect transistors," Nature, vol. 479, Nov. 17, 2011, pp. 2-8.

Flachowsky, S., et al., "Understanding Strain-Induced Drive-Current Enhancement in Strained-Silicon n-MOSFET and p-MOSFET," IEEE Transactions on Electron Devices, vol. 57, No. 6, Jun. 2010, pp. 1343-1354.

Gandhi, R. et al., "Vertical Si-Nanowire n-Type Tunneling FETs With Low Subthreshold Swing (<50 mV/decade) at Room Temperature," IEEE Electron Device Letters, vol. 32, No. 4, Apr. 2011, pp. 437-439.

Hashemi, P., et al., "Gate-All-Around n-MOSFETs With Uniaxial Tensile Strain-Induced Performance Enhancement Scalable to Sub-10-nm Nanowire Diameter," IEEE Electron Device Letters, vol. 30, Issue 4, Apr. 2009, pp. 401-403.

Ionescu, A.M. et al., "Tunnel field-effect transistors as energy-efficient electronic switches," Review, doi: 10.1038/nature10679, Nature, vol. 479 Nov. 17, 2011, pp. 329-337.

Kim, K., "Future Silicon Technology," 2012 Proceedings of the European Solid State Device Research Conference, (ESSDERC), Sep. 2012, pp. 1-6.

Kwong, D.-L. et al., "Vertical Silicon Nanowire Platform for Low Power Electronics and Clean Energy Applications," Hindawi Publishing Corporation, Journal of Nanotechnology, vol. 2012, Article ID 492121, May 2011, pp. 1-21.

Larrieu, G. et al., "Vertical nanowire array-based field effect transistors for ultimate scaling," The Royal Society of Chemistry, Jan. 2013, pp. 2437-2441.

Liang, J. et al., "Relaxation of compressed elastic islands on a viscous layer," Pergamon, www.actamat-journals.com, Acta Materialia 50, Jun. 2002, pp. 2933-2944.

Maheshwaram, S., et al., "Device Circuit Co-Design Issues in Vertical Nanowire CMOS Platform," IEEE Electron Device Letters, vol. 33, Issue 7, Jul. 2012, pp. 934-936.

Niquet, Y.-M. et al., "Carrier Mobility in strained Ge nanowires," Journal of Applied Physics, vol. 112, Issue 8, 084301, Oct. 2012, pp. 084301-1-084301-4.

Peterson, R.L. et al., "Comment on 'Fabrication of Strained Silicon on Insulator by Strain Transfer Process' [Appl. Phys. Lett. 87, 051921 (2005)]," Appl. Phys. Lett. 88, 146101 (2006), 3 pages.

Pham-Nguyen, et al., "Mobility enhancement by CESL strain in short-channel ultrathin SOI MOSFETs," Solid-State Electronics 54, www.elesevier.com/locate/sse, pp. 123-130, Dec. 2009.

Schmidt, V. et al., "Realization of a Silicon Nanowire Vertical Surround-Gate Field-Effect Transistor," Small, vol. 2, Issue 1, Jan. 2006, pp. 85-88.

Shen, N. et al., "Vertical GAA Silicon Nanowire Transistor with Impact of Temperature on Device Parameters," World Academy of Science, Engineering and Technology, Issue 48, Dec. 2010, pp. 976-979.

Sun, Y. et al., "Junctionless Vertical-Si-Nanowire-Channel-Based SONOS Memory With 2-Bit Storage per Cell," IEEE Electron Device Letters, vol. 32, Issue 6, Jun. 2011, pp. 725-727.

Thelander, C. et al., "Nanowire-based one-dimensional electronics," Materials Today, vol. 9, Issue 10, Oct. 2006, pp. 28-35.

Tomioka, K. et al., "A III-V nanowire channel on silicon for high-performance vertical transistors," Nature, vol. 488, Aug. 9, 2012, 14 pages.

Vandooren, A., et al., "Impact of process and geometrical parameters on the electrical characteristics of vertical nanowire silicon n-TFETs," Solid-State Electronics, vol. 72, Jun. 2012, pp. 82-87.

Wikipedia, "Strain engineering," http://en.wikipedia.org/wiki/Strain_engineering, downloaded Jul. 5, 2013, 2 pages.

Windbacher, T., "2.2.2 Local Strain," http://www.iue.tuwien.ac.at/phd/windbacher/node19.html, downloaded Jul. 5, 2013, 4 pages.

Yin, H., "Strain Relaxation of SiGe on Compliant BPSG and Its Applications," Dissertation Presented to the Faculty of Princeton University in Candidacy for the Degree of Doctor of Philosophy, Nov. 2004, 6 pages.

Yin, H. et al., "Strain relaxation of SiGe islands on compliant oxide," Journal of Applied Physics, vol. 91, No. 12, Jun. 15, 2002, pp. 9716-9722.

Zhu, Yong et al., "Mechanical Properties of Vapor-Liquid-Solid Synthesized Silicon Nanowires," Nano Letters, vol. 9, No. 11, pp. 3934-3939, Jul. 2009.

* cited by examiner

INDUCING LOCALIZED STRAIN IN VERTICAL NANOWIRE TRANSISTORS

PRIORITY CLAIM AND CROSS-REFERENCE

This application is a continuation-in-part application of the following commonly-assigned U.S. patent application: application Ser. No. 13/763,110, filed Feb. 8, 2013 entitled "Method for Inducing Strain in Vertical Semiconductor Columns," which application is hereby incorporated herein by reference.

BACKGROUND

Vertical Transistors are being researched recently. In a vertical transistor, a vertical column, which may be a vertical nano-wire formed of a semiconductor material, is formed over a substrate, which may be a bulk semiconductor wafer or a Semiconductor-On-Insulator (SOI) wafer. A gate dielectric and a gate electrode are formed to encircle the nano-wire, with the encircled portion of the nano-wire forming the channel of the respective vertical transistor. A source and a drain are formed, with one underlying the channel, and the other overlying the channel. The vertical transistor has a gate-all-around structure since the gate may fully encircle the channel. With the all-around gate structure, the drive current of the vertical transistor is high and short-channel effects are minimized.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
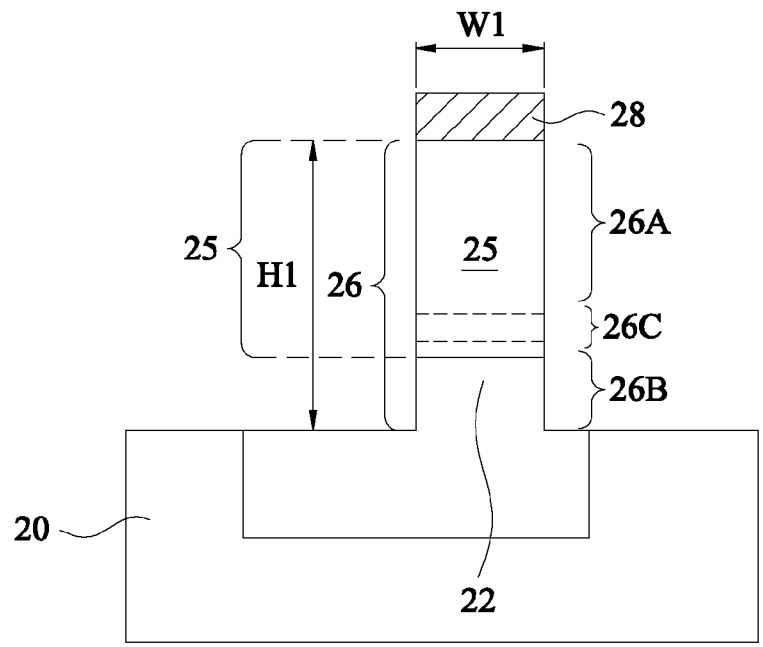
FIGS. 1A through 1Q are cross-sectional views of intermediate stages in the manufacturing of a vertical NMOS transistor in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Vertical nano-wire Metal-Oxide-Semiconductor (MOS) transistors and the methods of forming the same are provided in accordance with various exemplary embodiments. The intermediate stages of forming the vertical nano-wire transistors are illustrated in accordance with exemplary embodiments. The variations and the operation of the vertical nano-wire transistors are discussed. Throughout the various views and illustrative embodiments, like reference numbers are used to designate like elements.

FIG. 1A illustrates the initial steps for forming a vertical MOS transistor. Substrate 20, which is a portion of a semiconductor wafer, is provided. Substrate 20 may be a semiconductor substrate such as a silicon substrate, although other materials such as silicon germanium, silicon carbon, and the like, may be used. Substrate 20 may also be a bulk semiconductor substrate or a silicon-on-insulator substrate. In some embodiments, substrate 20 is lightly-doped with a p-type impurity. Region 22 is formed in substrate 20, for example, through an implantation step. Region 22 may be one of the source region or the drain region of the resulting vertical MOS transistor, and hence is referred to as a first source/drain region hereinafter. Throughout the description, when a region is referred to as a "source/drain" region, the region may be a source region or a drain region. The first source/drain region 22 (also referred to as a bottom source/drain region) may be heavily doped with an n-type impurity such as phosphorous, arsenic, and the like, for example, to an impurity concentration between about $1\times10^{19}/cm^3$ and about $1\times10^{21}/cm^3$.

Nano-wire 26 is formed over substrate 20, wherein the first source/drain region 22 may extend into nano-wire 26. In some embodiments, nano-wire 26 has a horizontal dimension W1 between about 10 nm and about 40 nm. It is appreciated, however, that the values recited throughout the description are merely examples, and may be changed to different values. The height H1 of nano-wire 26 may be between about 10 nm and about 45 nm. Hard mask 28 is formed over nano-wire 26, and may comprise silicon nitride, although other materials such as silicon oxide or oxynitride may be used. The formation of nano-wire 26 may include, after implanting a surface portion of substrate 20 to form source/drain region 22, performing an epitaxy to grow a semiconductor layer (such as silicon, silicon germanium, III-V semiconductor, or the like) over substrate 20, forming a hard mask layer over the epitaxy layer, and then patterning the hard mask layer and the epitaxy layer to form hard mask 28 and nano-wire 26, respectively. The epitaxy layer may have a homogeneous structure having a uniform material such as silicon or silicon germanium. Alternatively, the epitaxy layer may have a heterogeneous structure including more than one layer. For example, portion 26C of nano-wire 26 may be formed of germanium or silicon germanium, and portions 26A and 26B may be formed of silicon or silicon germanium. In the embodiments in which portions 26A, 26B, and 26C all include silicon germanium, the germanium percentage in portion 26C is greater than the germanium percentage in portions 26A and 26B. In the patterning for forming nano-wire 26, a slightly over-etch may be performed, so that a top portion of substrate 20 forms a bottom portion of nano-wire 26. The respective nano-wire 26 thus includes epitaxy portion 25 over first source/drain region 22. Epitaxy portion 25 may be a p-type region, an intrinsic region, or an n-type region, and may be in-situ doped during the epitaxy.

Figure 1B:
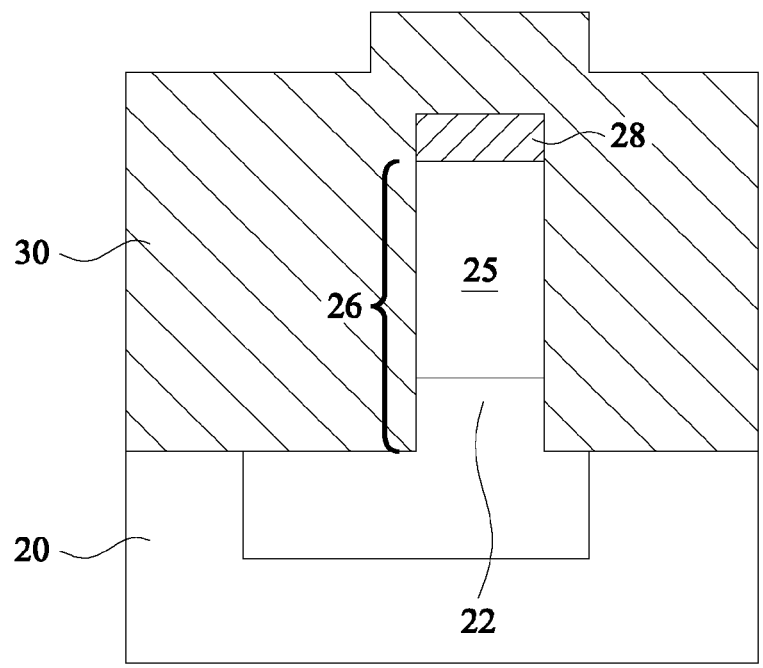
Figure 1C:
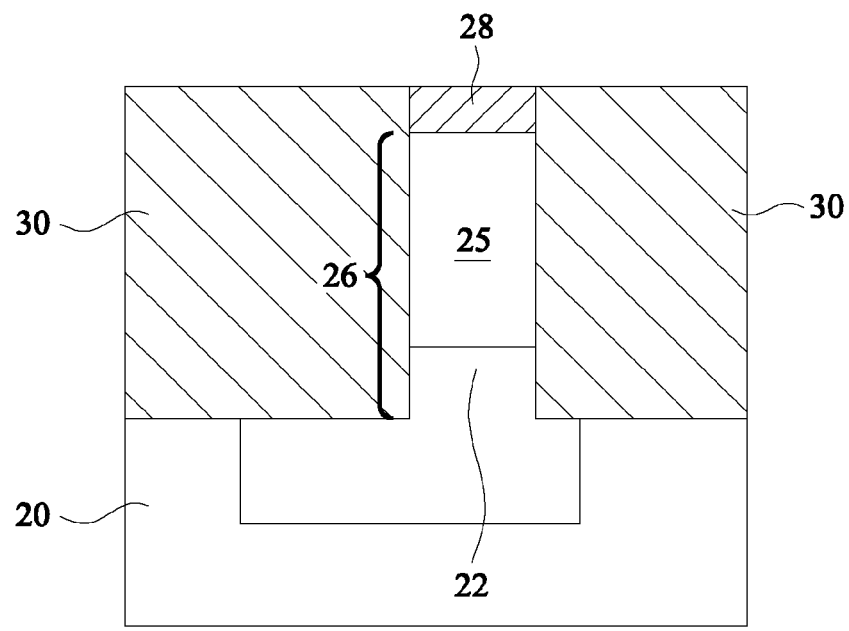
Figure 1D:
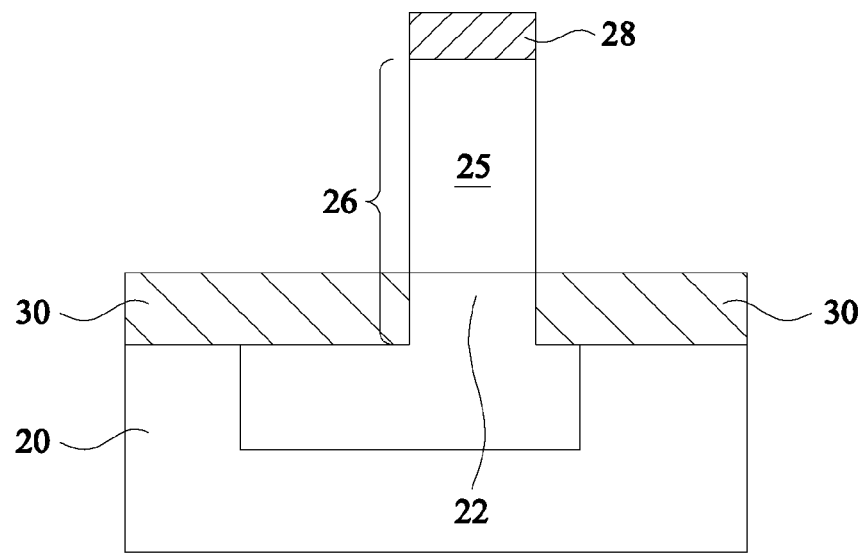

Referring to FIG. 1B, dielectric layer 30 is formed. In some embodiments, dielectric layer 30 comprises an oxide such as silicon oxide. The top surface of dielectric layer 30 is higher than hard mask 28. Next, as shown in FIG. 1C, a Chemical Mechanical Polish (CMP) is performed to level the top surface of dielectric layer 30 with the top surface of hard mask 28. In a subsequent step, as shown in FIG. 1D, an etch-back is performed on dielectric layer 30, and dielectric layer 30 is recessed. In some embodiments, the top surface of dielectric layer 30 is level with or lower than the interface between source/drain region 22 and epitaxy portion 25, although the top surface of dielectric layer 30 may be higher than or at the same height as the interface.

Figure 1E:
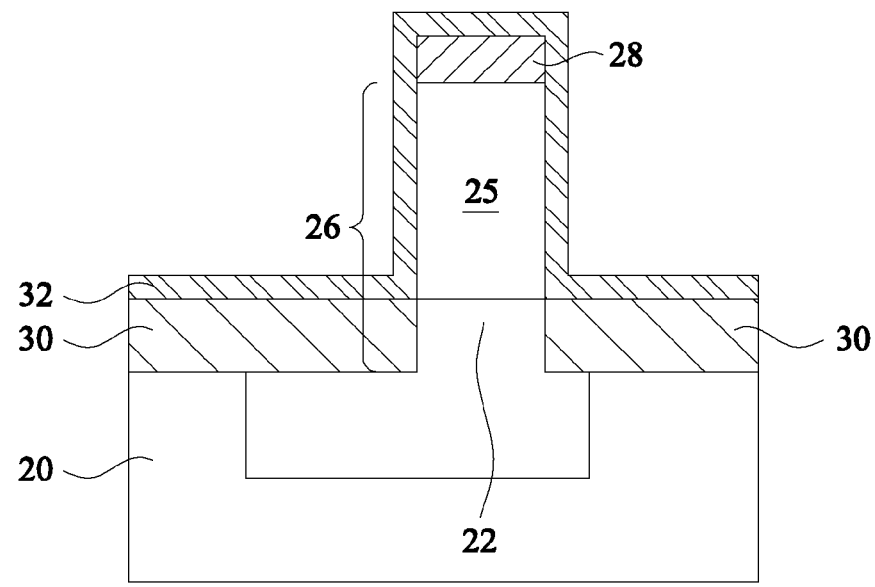
Figure 1F:
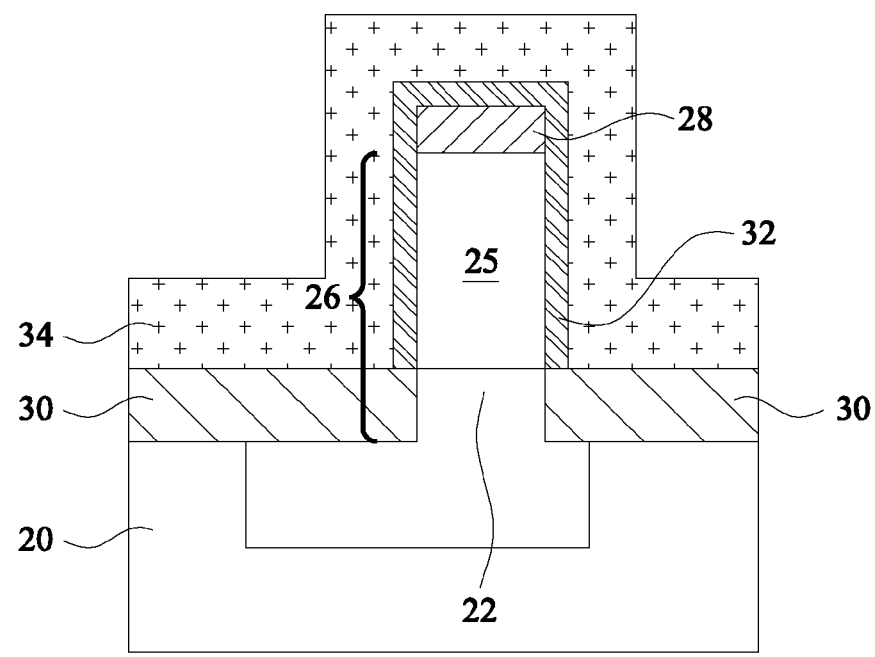

FIG. 1E illustrates the formation of gate dielectric layer 32. In some embodiments, gate dielectric layer 32 is formed in a conformal deposition process. Gate dielectric layer 32 may comprise a high-k dielectric material such as hafnium oxide, zirconium oxide, or the like. Other oxides and/or nitrides of Hf, Al, La, Lu, Zr, Ti, Ta, Ba, Sr, and/or the like, may also be used in gate dielectric layer 32. As shown in FIG. 1F, an etch step is then performed to remove the horizontal portions of gate dielectric layer 32, while the vertical portions of gate dielectric layer 32 are left on the sidewalls of nano-wire 26. Next, gate electrode layer 34 is formed over gate dielectric layer 32, as also shown in FIG. 1F. Gate electrode layer 34 may include Al, Ti, Ta, W, Mo, Ru, Pt, Co, Ni, Pd, Nb, or alloys thereof. In other embodiments, gate electrode layer 34 also includes metallic compound such as TiN, TaC, or TaN.

Figure 1G:
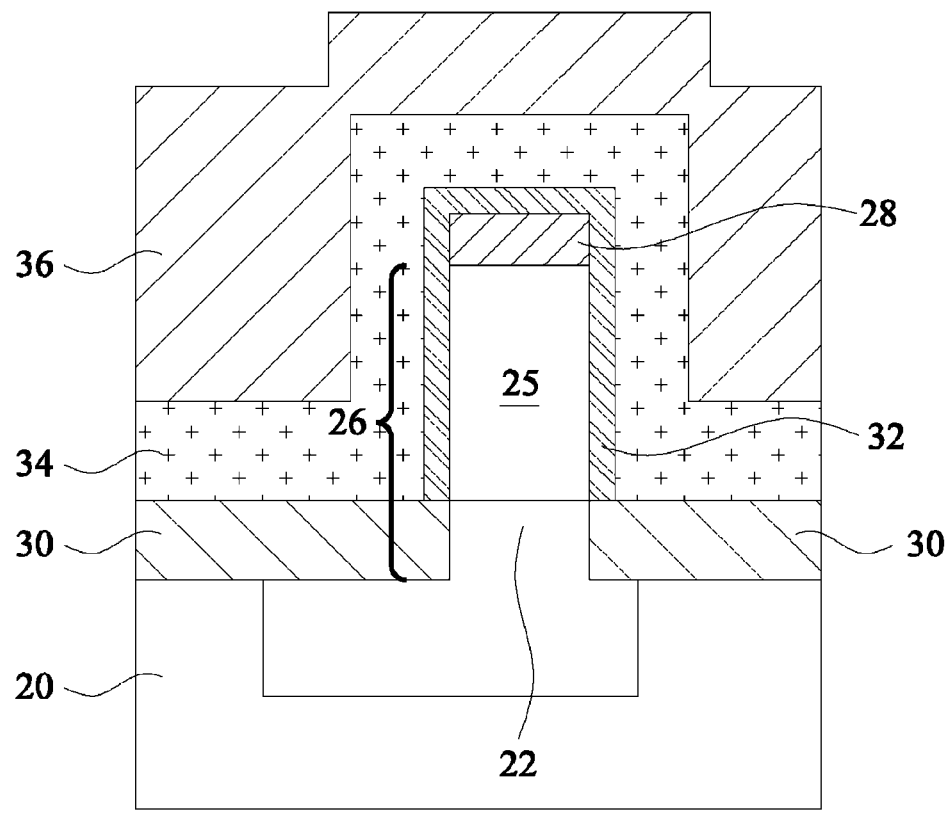
Figure 1H:
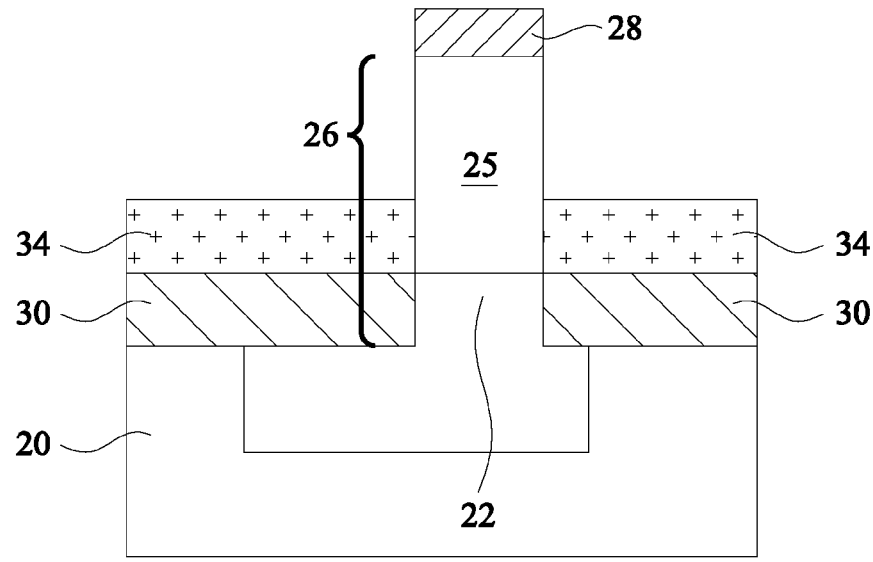

FIG. 1G illustrates the formation of sacrificial oxide 36, which is deposited to a level higher than the top surface of hard mask 28. A CMP is then performed to level the top surface of sacrificial oxide 36 with the top surface of hard mask 28. As shown in FIG. 1H, etch-back steps are then performed to remove the vertical portions of gate electrode layer 34 and the exposed portions of gate dielectric layer 32. The removed portions of gate dielectric layer 32 are over the horizontal portion of gate electrode layer 34. The remaining vertical portion of gate dielectric layer 32 is referred to as gate dielectric 32 hereinafter.

Figure 1I:
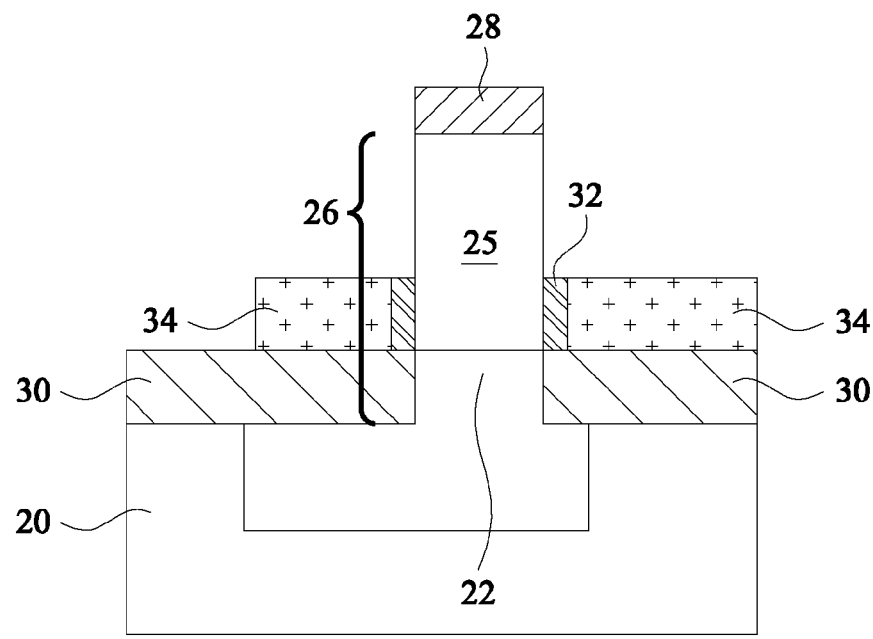

Next, referring to FIG. 1I, gate electrode 34 is further patterned. The remaining portion of gate electrode layer 34 is referred to as gate electrode 34 hereinafter. Gate dielectric 32 and gate electrode 34 form the gate stack of the resulting vertical MOS transistor. In a top view of the structure in FIG. 1I, gate dielectric 32 and gate electrode 34 encircle nano-wire 26.

Figure 1J:
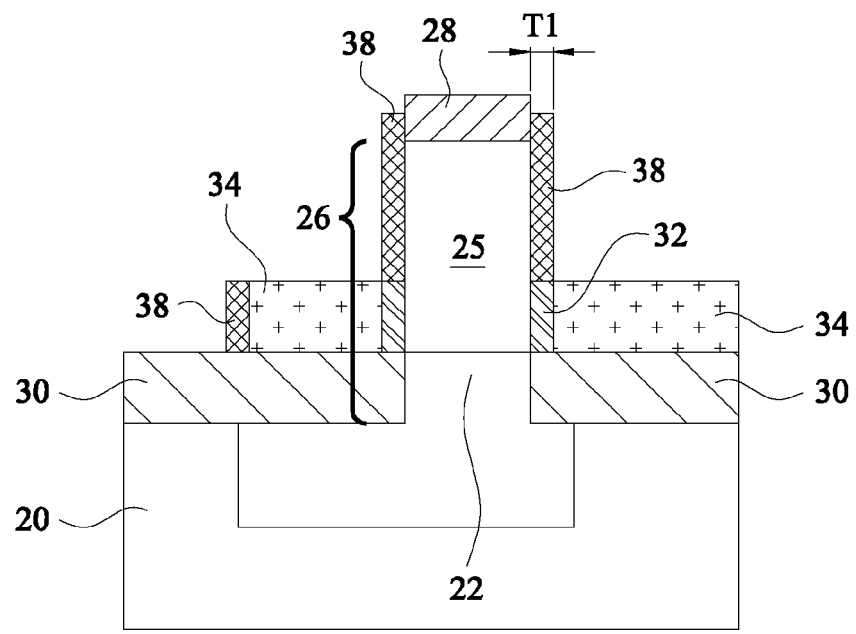

Next, as shown in FIG. 1J, low-viscosity spacer 38 is formed on the sidewalls of nano-wire 26, and over gate electrode 34. Low-viscosity spacer 38 encircles, and is in contact with, the top portion of nano-wire 26. The material of low-viscosity spacer 38 is selected, so that at temperatures (for example, between about 400° C. and about 1,000° C.) that are used in the subsequent oxidation of nano-wire 26, low-viscosity spacer 38 is at least softened to have certain viscosity, and hence stress may be generated more efficiently in nano-wire 26. In some embodiments, low-viscosity spacer 38 comprises Boron-Doped Phospho-Silicate Glass (BPSG), silicon germanium oxide, or the like, which have melting and softening temperatures lower that of silicon oxide. Alternatively stated, when heated with gradually increased temperatures, low-viscosity spacer 38 becomes soft earlier than silicon oxide. Thickness T1 of low-viscosity spacer 38 may be between about 0.5 nm and about 4 nm in accordance with exemplary embodiments.

Figure 1K:
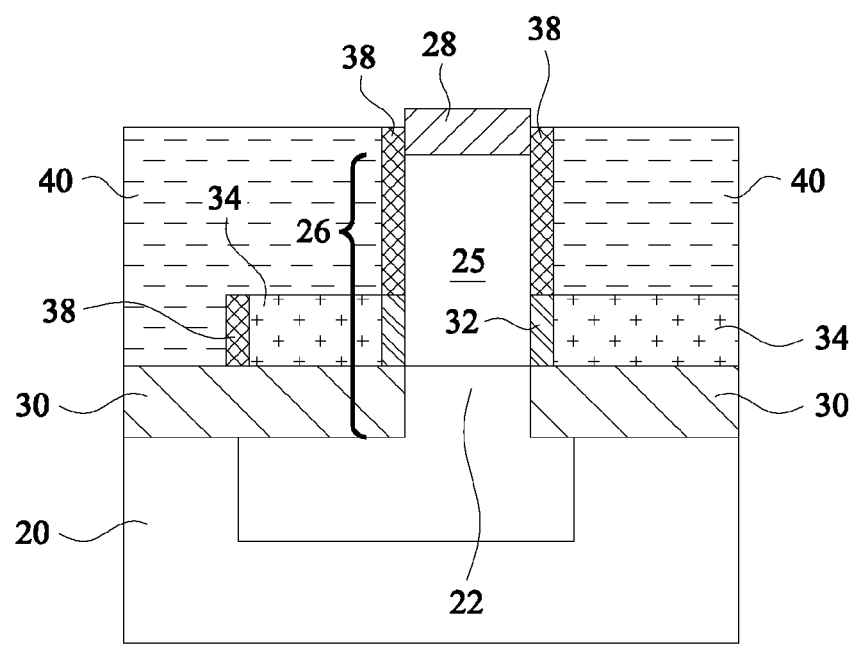
Figure 1L:
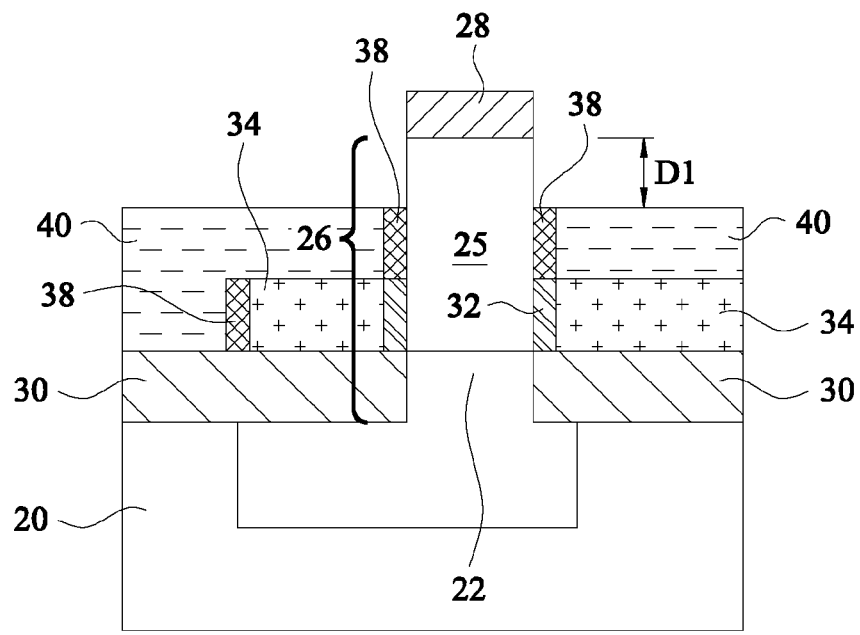

FIG. 1K illustrates the formation of dielectric layer 40 and the CMP step. In some embodiments, dielectric layer 40 comprises silicon oxide ($SiO_2$), although other dielectric materials may be used. Dielectric layer 40 and low-viscosity spacer 38 are then etch back, as shown in FIG. 1L, and hence the top surfaces of dielectric layer 40 and low-viscosity spacer 38 are recessed. Depth D1 of the resulting dielectric layer 40 and low-viscosity spacer 38 may have depth D1 greater than about 2 nm, for example. The top portion of nano-wire 26 thus protrudes over the top surface of dielectric layer 40.

Figure 1M:
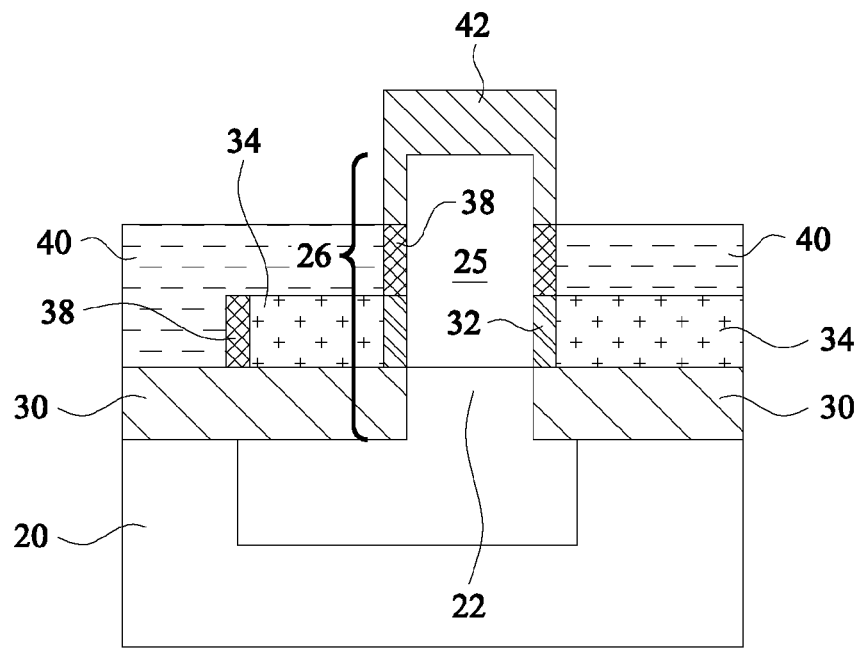

In accordance with some embodiments, hard mask 28 may be removed, and the resulting structure is shown in FIG. 1M. In alternative embodiments, hard mask 28 is removed in a later step, such as in a step after the step shown in FIG. 1O, and before the step shown in FIG. 1P. Non-permeable layer 42 is formed on the top surface and sidewalls of the protruding nano-wire 26. Non-permeable layer 42 is formed of a material that is not permeable by oxygen ($O_2$). The thickness of non-permeable layer 42 is also great enough to block the penetration of oxygen, and the thickness may be between about 1 nm and about 5 nm in accordance with exemplary embodiments. Non-permeable layer 42 has a shape of a cap, with a top portion, and a ring portion underlying and connected to the top portion. The ring portion encircles low-viscosity spacer 38.

The structure in FIG. 1M may then go through a local oxidation process, during which the structure in FIG. 1M is placed in an oxygen-containing ambient, and is heated. The oxygen-containing ambient may comprise oxygen ($O_2$), for example. In the local oxidation, the respective wafer may be heated to an elevated temperature between about 450° C. and about 1,000° C. The local oxidation may be performed for a period of time between about 1 minutes and about 100 minutes. In other embodiments, the oxidation is performed through a chemical oxidation at a low temperature, for example, using a chemical oxidizing agent or an oxidizing plasma. During the local oxidation, non-permeable layer 42 prevents oxygen from penetrating, and hence the portion of nano-wire 26 protected by non-permeable layer 42 is not oxidized. As a result of the local oxidation, the oxygen penetrates through the top portion of dielectric layer 40, and hence a middle portion of nano-wire 26 is oxidized to form oxide ring 44, which encircles, and extends into, nano-wire 26. The oxidized middle portion is close to the interface between non-permeable layer 42 and dielectric layer 40. Oxide ring 44 extends beyond the respective sidewalls of nano-wire 26. The resulting nano-wire 26 thus includes a first portion over oxide ring 44, a second portion underlying oxide ring 44, and a third portion encircled by oxide ring 44. The first portion and the second portion of nano-wire 26 may have a similar horizontal width W1, while the third portion has a second horizontal width W2 smaller than horizontal width W1. Oxide ring 44 may be in contact with the underlying low-viscosity layer 38 and the underlying non-permeable layer 42.

As a result of the local oxidation, the generated oxide ring 44 has a volume greater than the volume of the oxidized portion of nano-wire 26. Oxide ring 44 is hence expanded in volume over the oxidized portion of nano-wire 26, generating tensile strain 46 in nano-wire 26. During the oxidation, low-viscosity spacer 38 is at least slightly softened, and hence it is easier for nano-wire 26 to have the shape change and volume change, and hence the tensile strain 46 is easy to be generated. Low-viscosity spacer 38 thus acts as the lubricant for the generation of tensile strain 46. Tensile strain 46 may be as high as about 2 G Pascal to about 8 G Pascal in accordance with simulation results. The formation of low-viscosity spacer 38 can be omitted if the strained is desirable to be concentrated in the upper part (drain side) of the respective transistor.

Figure 1N:
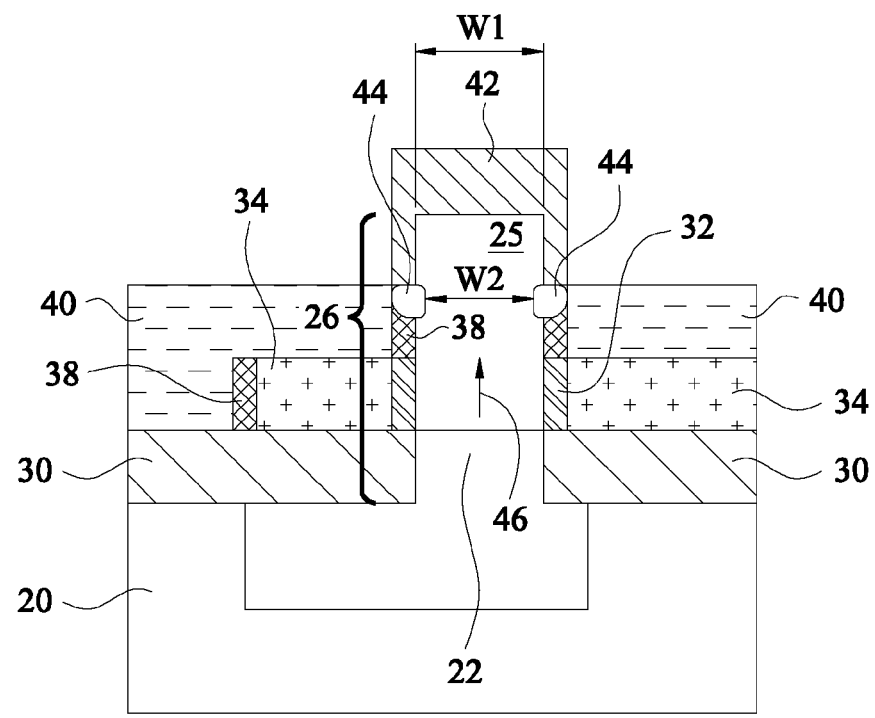
Figure 1O:
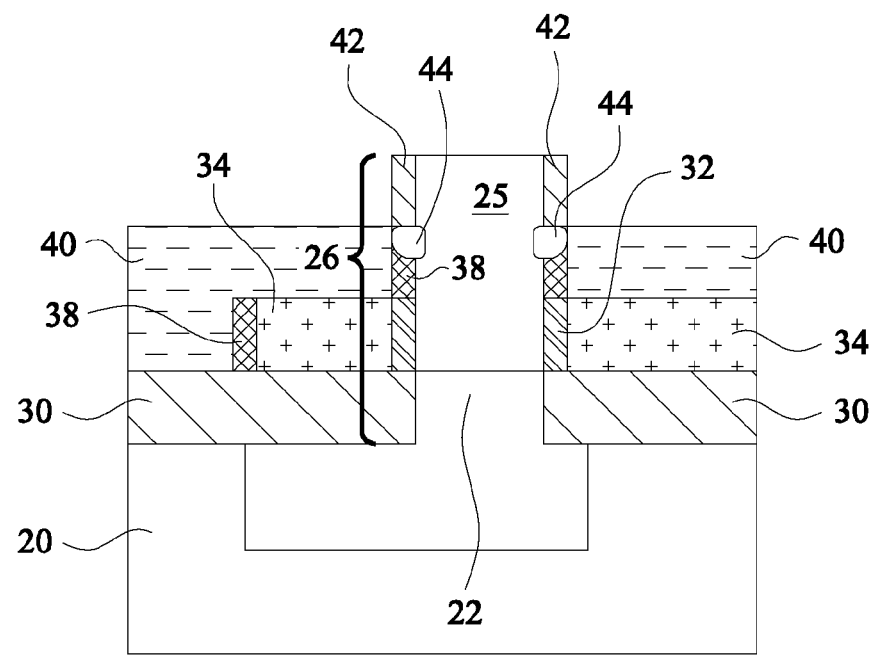
Figure 1P:
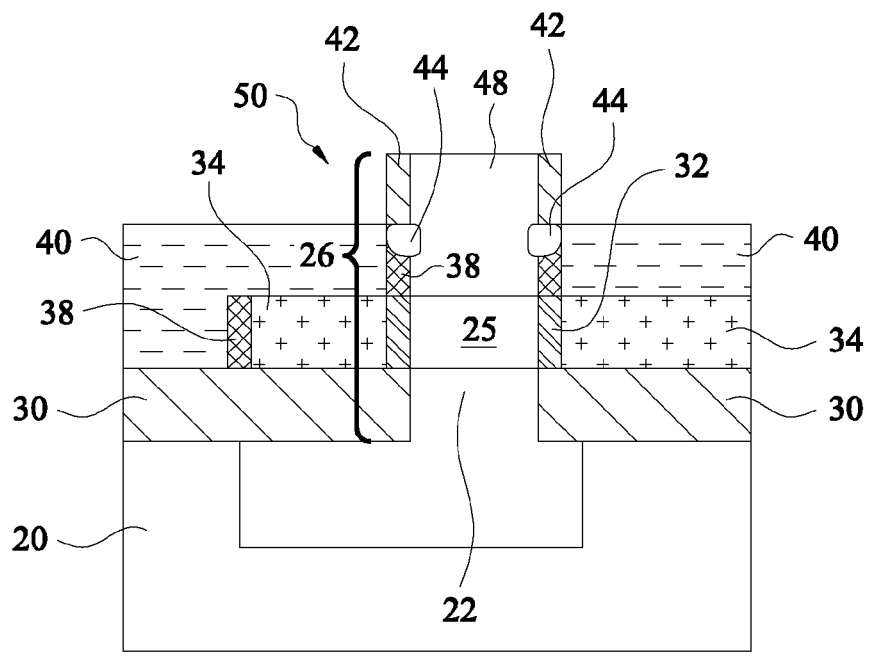

Next, referring to FIG. 1O, the top portion of non-permeable layer 42, which portion is over nano-wire 26, is removed. If hard mask 28 (FIG. 1L) has not been removed yet, it may also be removed at this stage. The sidewall portion of non-permeable layer 42 encircling the top portion of nano-wire 26 may be left un-removed. FIG. 1P illustrates the doping of the top portion of nano-wire 26 to form source/drain region 48, wherein the doping step may be achieved by implanting an n-type impurity. Source/drain region 48 is also referred to as a top source/drain region throughout the description. Source/drain region 48 may be heavily doped to an impurity concentration between about $1 \times 10^{19}/cm^3$ and about $1 \times 10^{21}/cm^3$. At least a portion of nano-wire 26 encircled by gate electrode 34 is not doped in this step, which portion forms the channel of the resulting vertical MOS transistor 50. Alternatively, the doping of the top portion of the wire can be performed before the growth of the strain-generating oxide.

Figure 1Q:
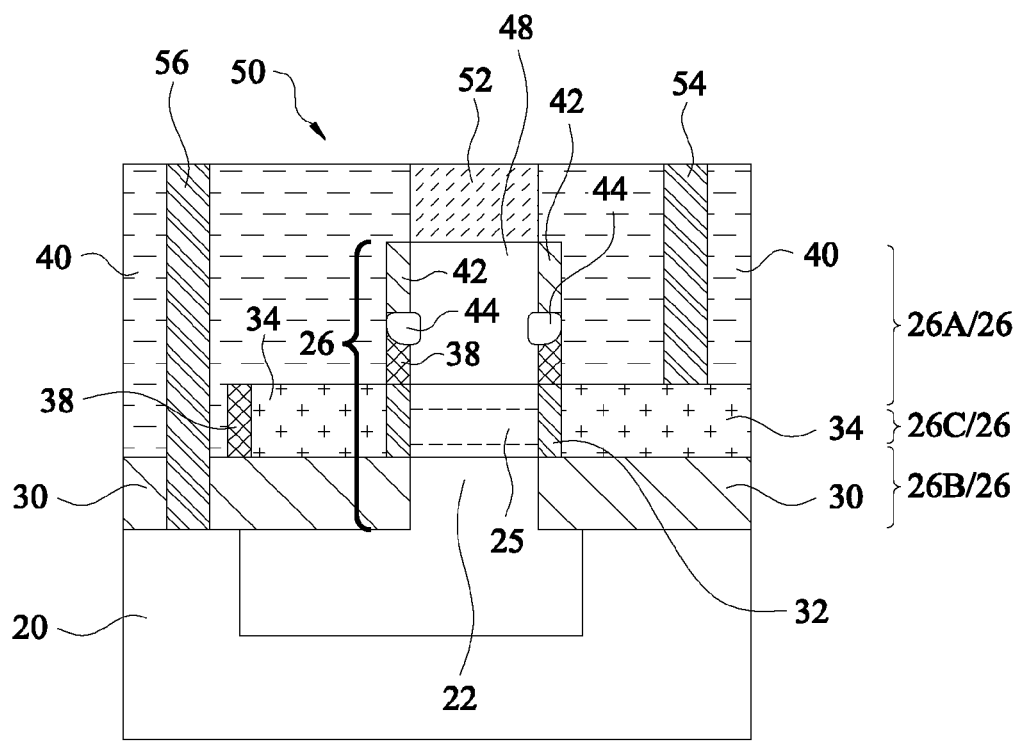

FIG. 1Q illustrates the formation of gate contact plug 54 and source/drain contact plugs 52 and 56. Gate contact plug 54 may comprise a metal comprising W, Ti, Ni, Co, or the silicides thereof including $TiSi_2$, $NiSi_2$, $WSi_2$, $CoSi_2$, or the like. Gate contact plug 54 is electrically coupled to gate electrode 34. Source/drain contact plugs 52 and 56 are electrically coupled to source/drain regions 48 and 22, respectively. MOS transistor 50 is hence formed. MOS transistor 50 is an NMOS transistor, and hence tensile strain 46 (FIG. 1N) helps improve its drive current Ion.

FIGS. 2A through 2G illustrate cross-sectional views of intermediate stages in the formation of an NMOS transistor in accordance with alternative embodiments. Unless specified otherwise, the materials and the formation methods of the components in these embodiments are essentially the same as the like components, which are denoted by like reference numerals in the embodiments shown in FIGS. 1A through 1Q. The details regarding the formation process and the materials of the components shown in FIGS. 2A through 2G may thus be found in the discussion of the embodiment shown in FIGS. 1A through 1Q.

The initial steps of these embodiments are essentially the same as shown in FIGS. 1A through 1I. Next, referring to FIG. 2A, low-viscosity spacer 38 is formed on the sidewalls of nano-wire 26, and encircles nano-wire 26. Low-viscosity spacer 38 may comprise BPSG or silicon germanium oxide, for example. Non-permeable layer 42 is also formed, which may be formed of silicon nitride, for example. In these embodiments, non-permeable layer 42 forms a ring that encircles low-viscosity spacer 38. Non-permeable layer 42 is hence referred to as non-permeable ring 42 hereinafter.

Figure 2A:
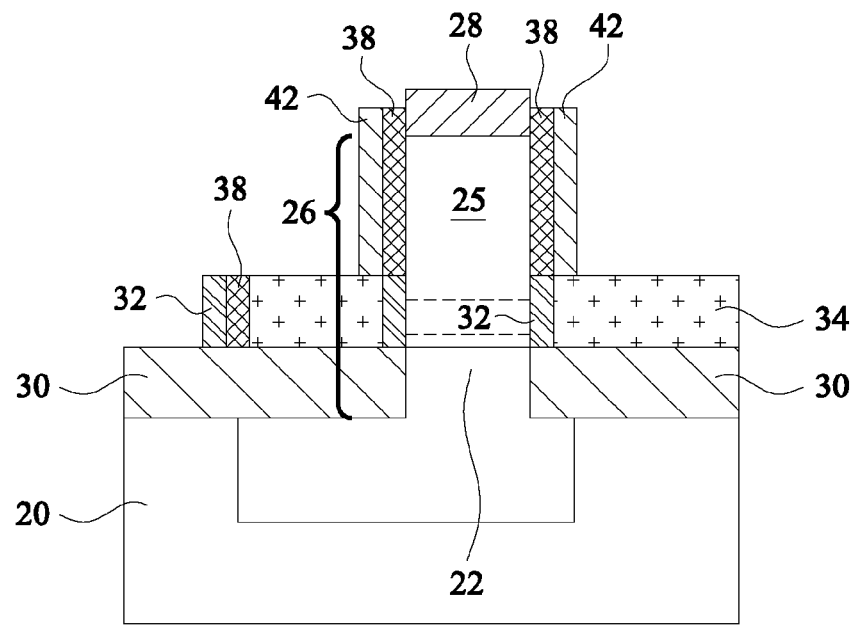
FIGS. 2A through 2G are cross-sectional views of intermediate stages in the manufacturing of a vertical NMOS transistor in accordance with alternative exemplary embodiments.
Figure 2B:
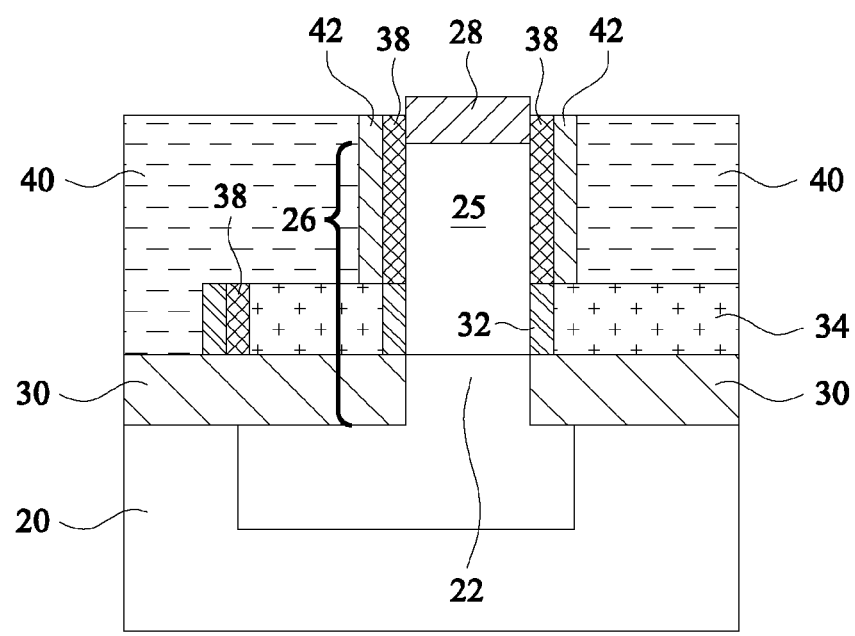
Figure 2C:
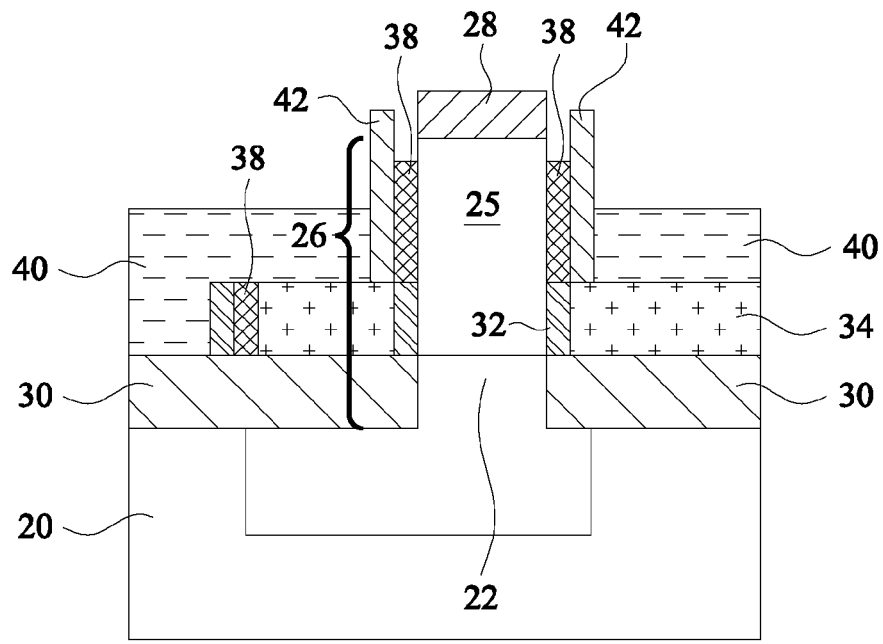
Figure 2D:
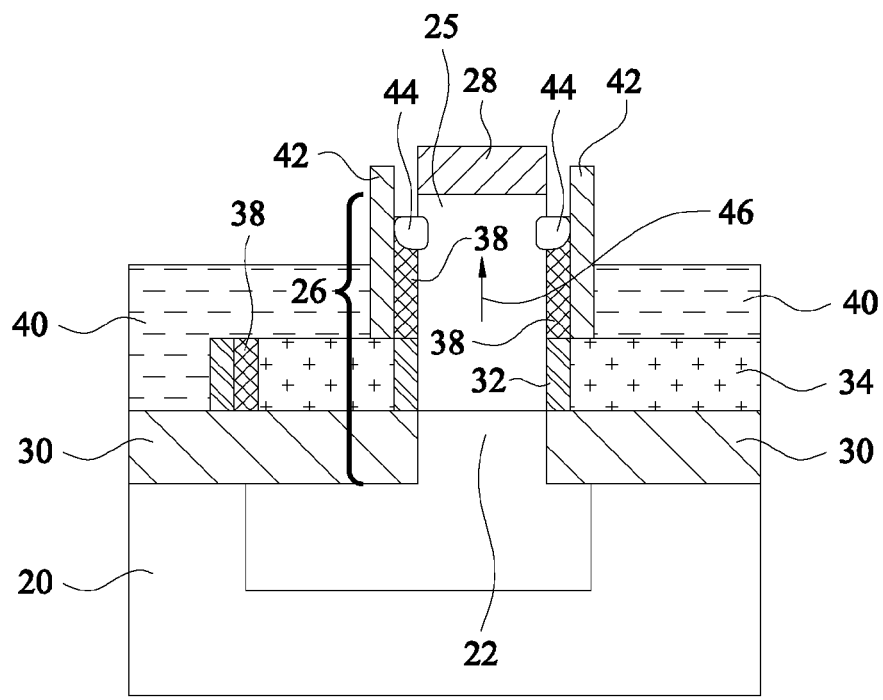

Referring to FIG. 2B, dielectric layer 40 is formed, followed by a CMP step, wherein hard mask 28 and non-permeable layer 42 may act as the CMP stop layer. Dielectric layer 40 is then recessed, as shown in FIG. 2C, followed by a local oxidation step to generate oxide regions 44, as shown in FIG. 2D. The local oxidation is performed by oxidizing a top portion (a top ring) of nano-wire 26. The top end of oxide ring 44 is substantially level with the top surface of nano-wire 26. Oxide ring 44 also extends beyond the respective sidewalls of nano-wire 26. Again, due to the expansion in the volume of the oxidized portion of nano-wire 26, tensile stress may be generated in nano-wire 26, wherein low-viscosity spacer 38 makes the generation of the tensile stress easier. The formation of low-viscosity spacer 38 can be omitted if the strained is desirable to be concentrated in the upper part (drain side) of the respective transistor.

Figure 2E:
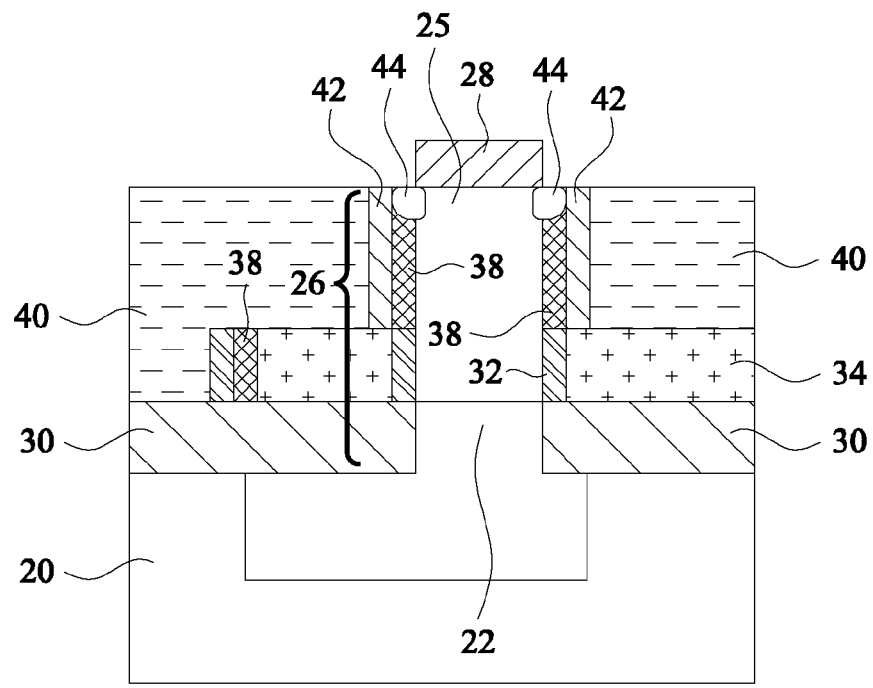
Figure 2F:
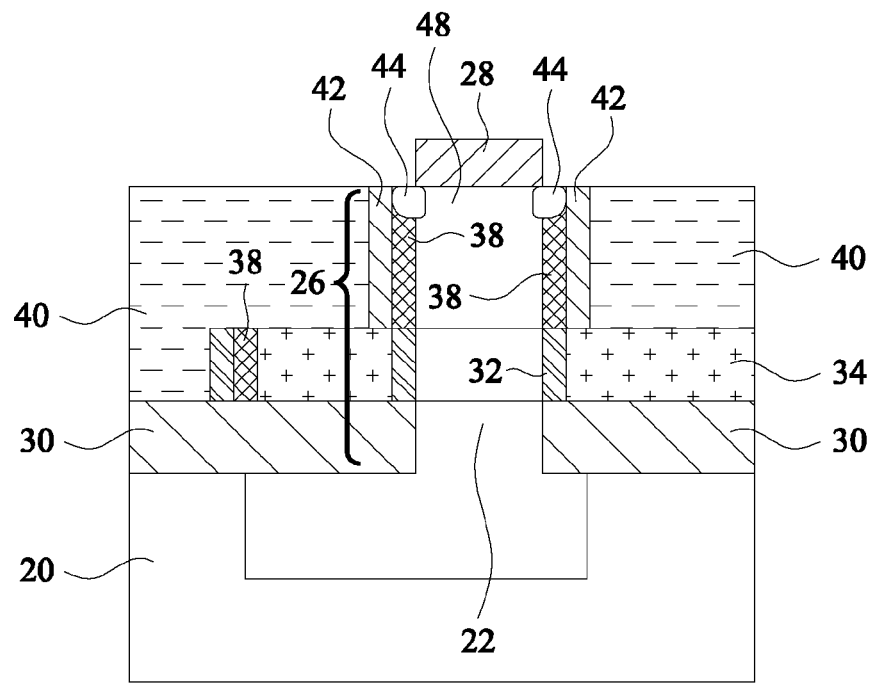
Figure 2G:
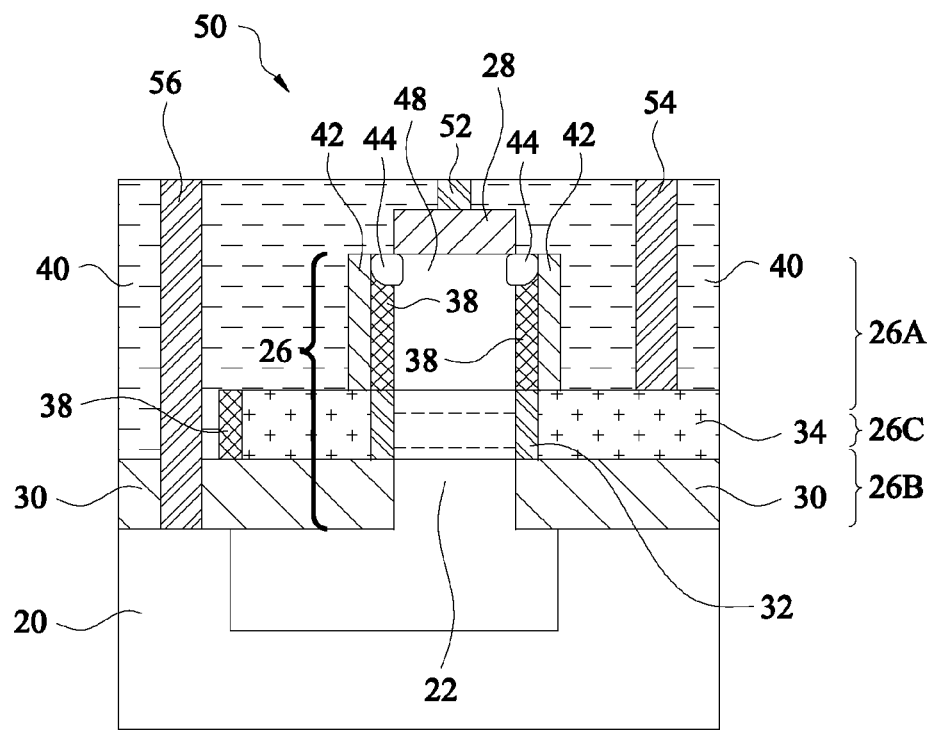

FIG. 2E illustrates the replenishment of dielectric layer 40. Next, as shown in FIG. 2F, an implantation is performed to form source/drain region 48. Source/drain region 48 may be heavily doped to an n-type impurity concentration between about $1 \times 10^{19}/cm^3$ and about $1 \times 10^{21}/cm^3$. Contact plugs 52, 54, and 56 are then formed to finish the formation of vertical MOS transistor 50, as shown in FIG. 2G. Alternatively, the doping of the top portion of the transistor can be achieved prior to the growth of the strain-generating oxide.

FIGS. 3A through 3G illustrate cross-sectional views of intermediate stages in the formation of a vertical PMOS transistor in accordance with alternative embodiments. Unless specified otherwise, the materials and formation methods of the components in these embodiments are similar to the like components, which are denoted by like reference numerals in the embodiments shown in FIGS. 1A through 2G. The details regarding the formation process and the materials of the components shown in FIGS. 3A through 3G may thus be found in the discussion of the embodiment shown in FIGS. 1A through 2G.

Figure 3A:
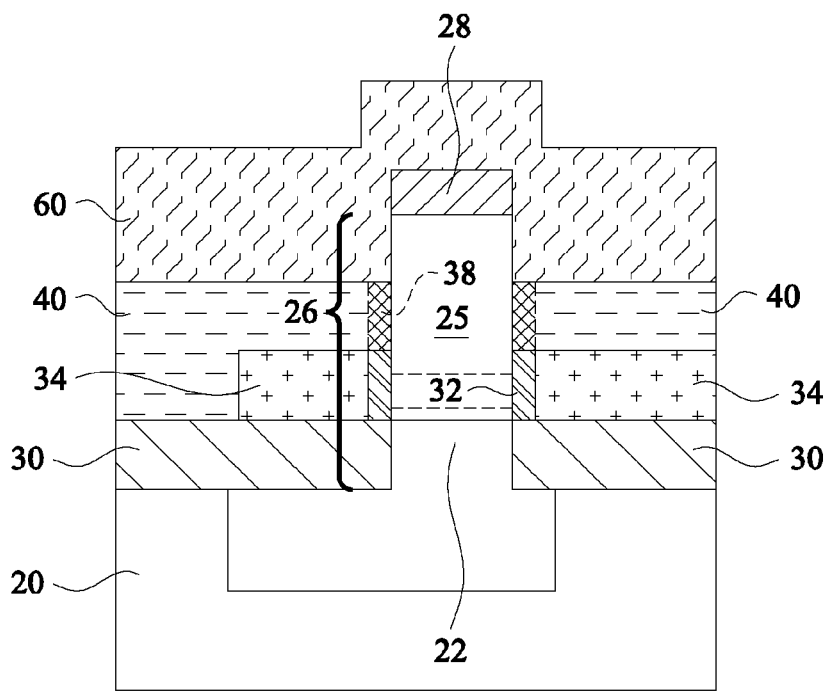
FIGS. 3A through 3G are cross-sectional views of intermediate stages in the manufacturing of a vertical PMOS transistor in accordance with some exemplary embodiments.
Figure 3B:
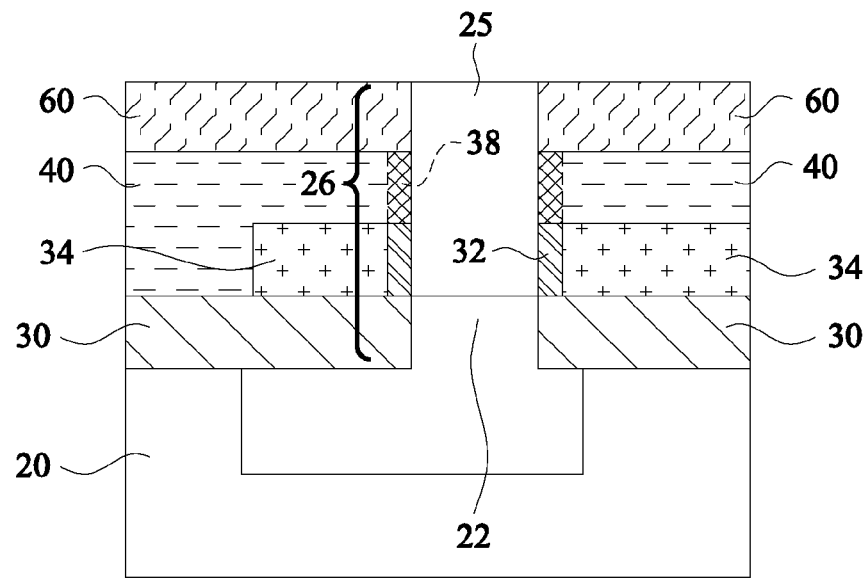

The initial steps of these embodiments are similar to shown in FIGS. 1A through 1I. Source/drain region 22 is of p-type in these embodiments. Next, referring to FIG. 3A, dielectric layer 40 is formed, followed by an etch back of dielectric layer 40. After the etch back, A top portion of nano-wire 26 is above the top surface of dielectric layer 40. Hard mask layer 60 is then formed over hard mask 28 and dielectric layer 40. Hard mask layer 60 may comprise silicon nitride in accordance with some embodiments, although different materials that are difficult for oxygen to penetrate may be used. Next, as shown in FIG. 3B, hard mask 28 and the portion of hard mask layer 60 overlapping hard mask 28 are removed, for example, in a CMP step. The top surface of nano-wire 26 is exposed through hard mask 60. Similar to the embodiments shown in FIGS. 1A through 2G, for vertical PMOS transistors, low-viscosity spacer 38 may be formed to encircle nano-wire 26, as schematically illustrated in FIG. 3B.

Figure 3C:
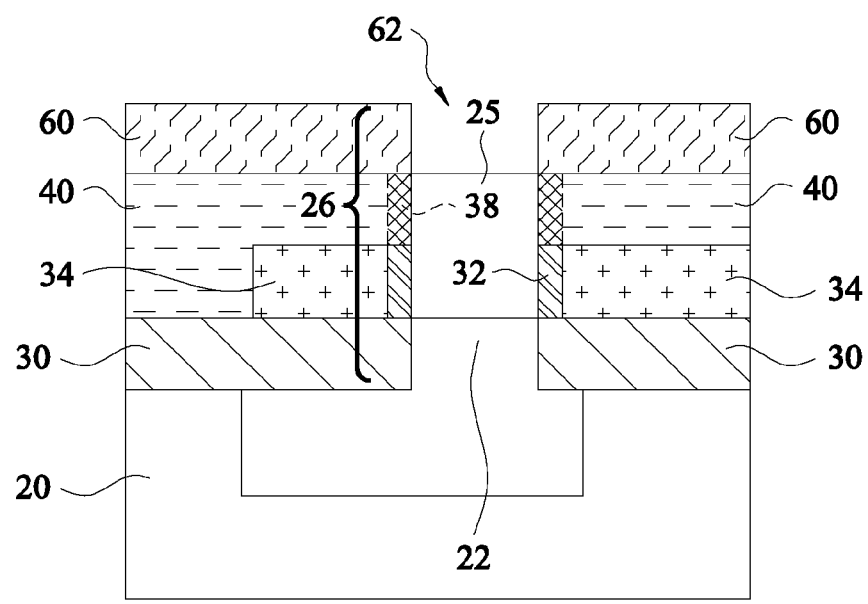
Figure 3D:
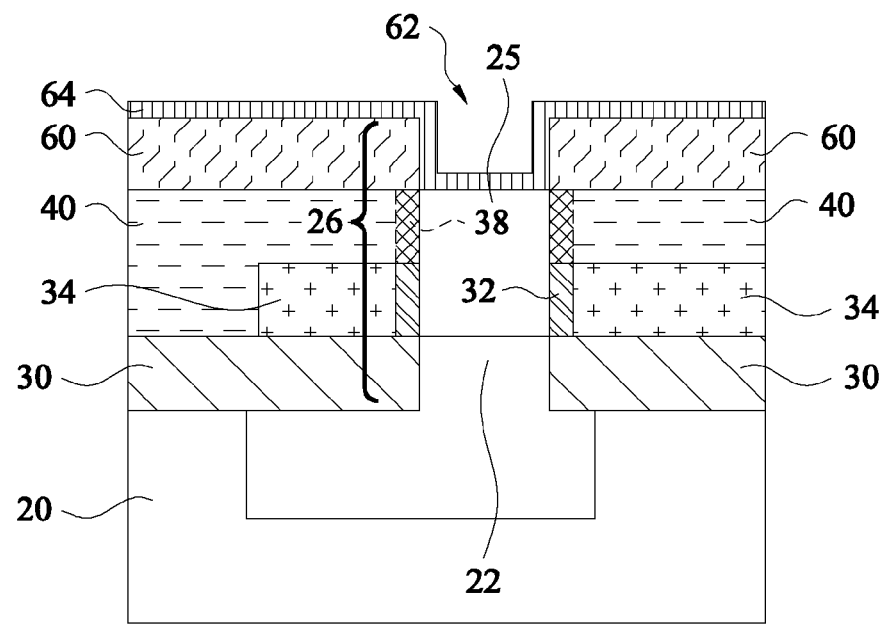

FIG. 3C illustrates the recess of nano-wire 26, which includes etching nano-wire 26. Opening 62 is thus formed in hard mask 60. The top surface of the remaining nano-wire 26 may be substantially level with or lower than the bottom surface of hard mask 60. Hard mask layer 64 is then formed as a substantially conformal layer over hard mask 60 and dielectric layer 40, and extends into opening 62. Hard mask layer 64 has a thickness smaller than one half, and may be smaller than about 25 percent, the thickness of hard mask 60. Hard mask layer 64 may comprise silicon nitride in accordance with some embodiments, although other materials that are difficult for oxygen to penetrate may also be used.

Figure 3E:
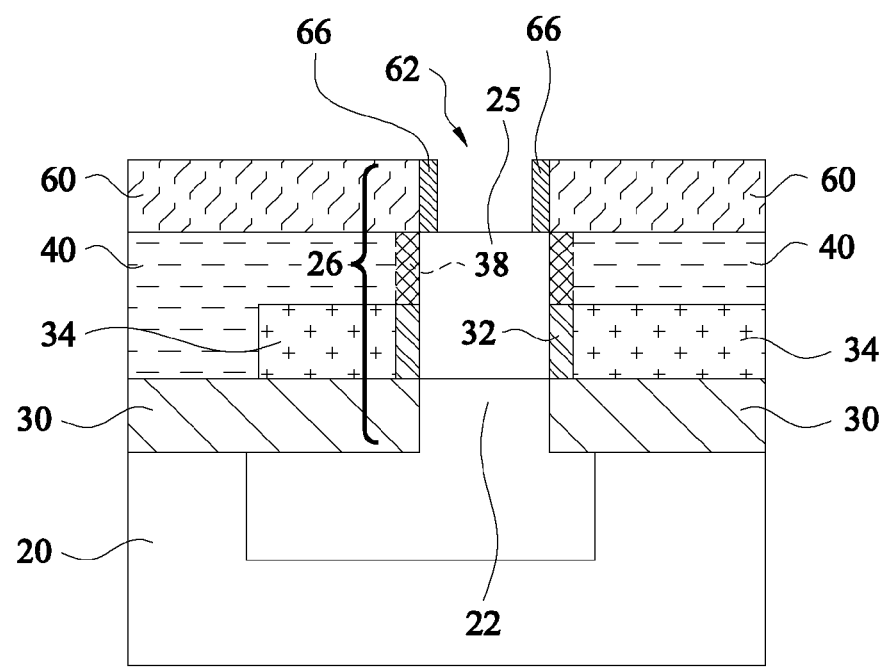

FIG. 3E illustrates the removal of the horizontal portions of hard mask layer 64 (FIG. 3D), which may be achieved, for example, through an anisotropic etch step. The remaining portion of hard mask layer 64 in opening 62 forms spacer 66, which is a ring on the sidewall of hard mask 60. Although spacer ring 66 and hard mask 60 may be formed of the same material or different materials. Since they are formed in different processes, there may be a distinguishable interface between spacer ring 66 and hard mask 60, regardless of whether they are formed of the same material or not. A portion of nano-wire 26 is exposed through the center region of spacer ring 66.

Figure 3F:
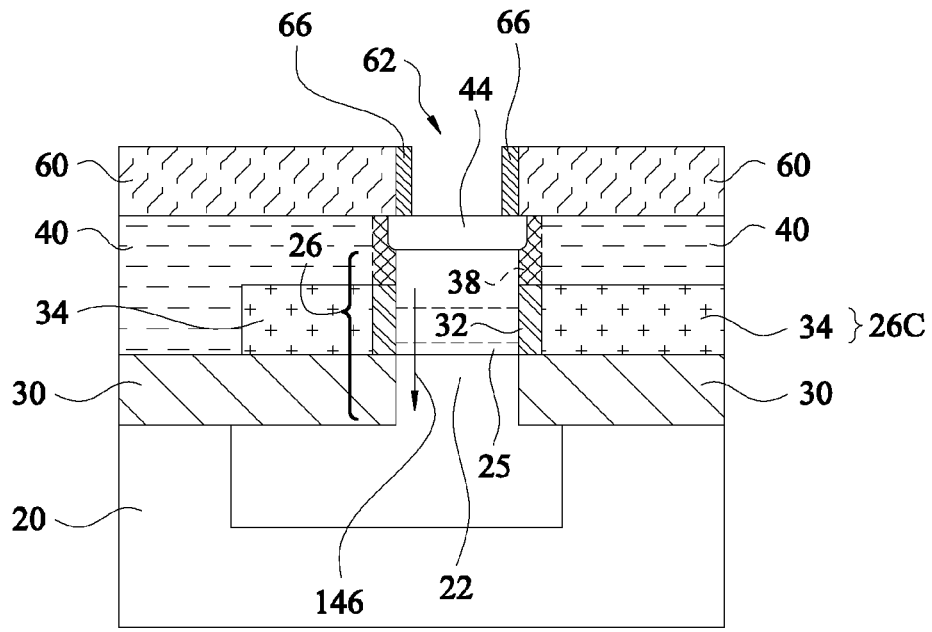
Figure 3G:
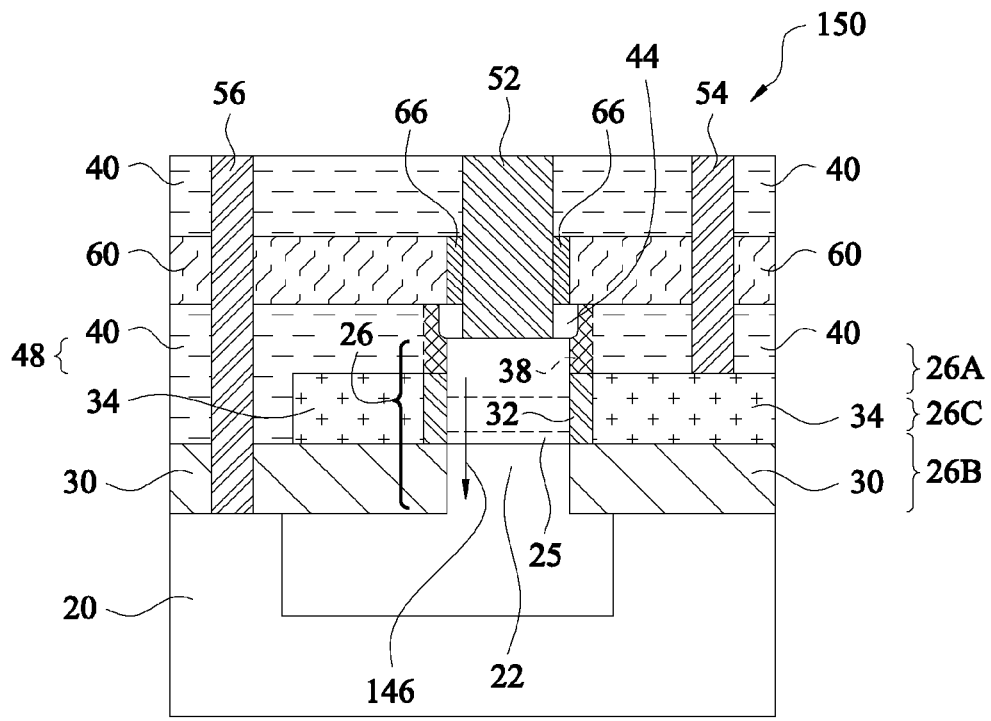

Next, as shown in FIG. 3F, a local oxidation is performed to oxidize the top portion of nano-wire 26. In some embodiments, the process conditions are chosen, so that an entirety of a top layer of nano-wire 26 is oxidized, and hence the edge portion of the resulting oxide region 44 extends beyond the respective sidewalls of nano-wire 26, and extends directly under hard mask 60. The edge portion of oxide region 44, which edge portion is overlapped by hard mask 60, may also have a ring shape. Due to the expansion in the volume of the oxidized portion of nano-wire 26, and further due to the fact the hard mask 60 suppresses the expansion in the volume, a compressive stress 146 is generated in nano-wire 26. After the local oxidation, the remaining components such as contact plugs 52, 54, and 56 are formed to finish the formation of PMOS transistor 150, as shown in FIG. 3G. In the resulting PMOS transistor 150, the remaining portion of oxide region 44 may also form a ring, with source/drain contact plug 52 extending through the oxide ring 44 to electrically couple to source/drain region 48.

Figure 4:
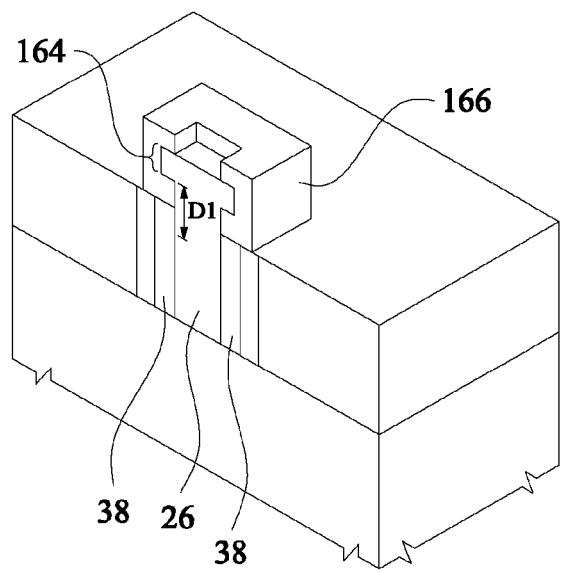
FIG. 4 illustrates a vertical NMOS structure that is used to simulate the stress in NMOS transistors.
Figure 5:
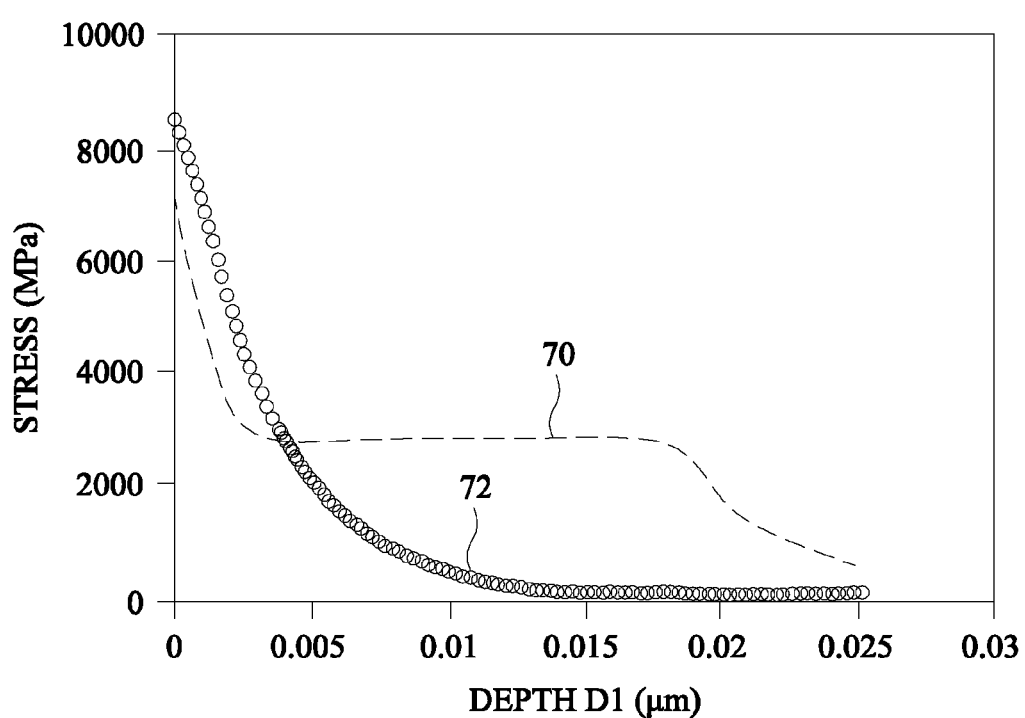
FIG. 5 illustrates the simulated stress in the vertical NMOS structure.

FIG. 4 illustrates a structure that is used to simulate the tensile stress generated in NMOS transistors 50 (FIGS. 1Q and 2G). In the simulated structure, semiconductor cap 164 is located over and connected to nano-wire 26. The oxidation of the outer portions of semiconductor cap 164 results in oxide region 166. Portions of oxide region 166 extend underlying and overlapped by the edge portions of semiconductor cap 164. The formation of oxide region 166 results in the expansion in volume of the oxidized portion of semiconductor cap 164, and hence a tensile stress is generated in nano-wire 26. The simulated result of the stress is shown as line 70 in FIG. 5, wherein the tensile stress in nano-wire 26 is illustrated as a function of distance D1 (FIG. 4), wherein distance D1 is measured from the bottom of semiconductor cap 164. The results indicated that the tensile stress may be as high as 8 G Pascal, and the stress may remain high when distance D1 is smaller than about 0.02 μm. This means that the high tensile stress may be formed in the channel of vertical NMOS transistors as long as the distance of the channel from the bottom of semiconductor cap 164 is smaller than about 0.02 μm. Line 70 is simulated with low-viscosity layer 38 (FIG. 6) surrounding nano-wire 26. If low-viscosity layer 38 is replaced by hard silicon oxide, then the respective simulated result is shown as line 72. Compared to line 70, line 72 drops much faster than line 70 when distance D1 increases. This means that it is more difficult to generate a high tensile stress in the channel if low-viscosity layer 38 is not formed, unless the channel is formed very close to the bottom of semiconductor cap 164.

Figure 6:
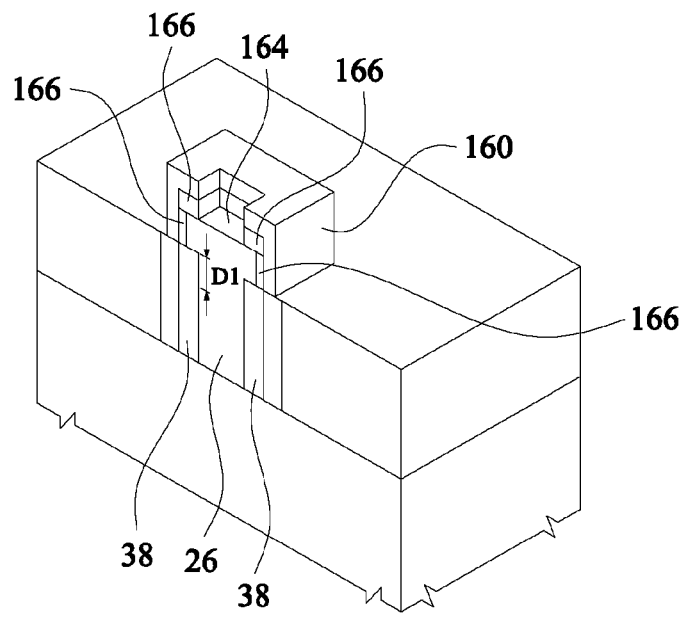
FIG. 6 illustrates a vertical PMOS structure that is used to simulate the stress in PMOS transistors.
Figure 7:
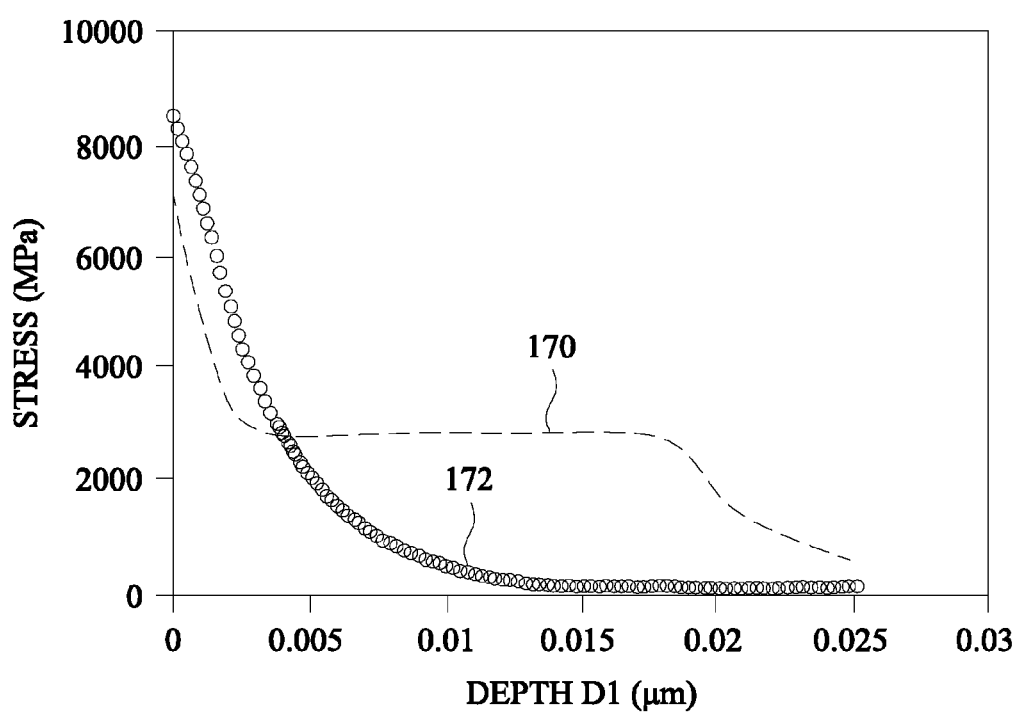
FIG. 7 illustrates the simulated stress in the vertical PMOS structure.

FIG. 6 illustrates a structure that is used to simulate the compressive stress generated in vertical PMOS transistor 150 (FIG. 3G). In the simulated structure, a semiconductor cap 164 is located over and connected to nano-wire 26. The oxidation of semiconductor cap 164 results in oxide region 166. Hard mask 160 is formed to suppress the volume expansion caused by the formation of oxide region 166, and hence a compressive stress is generated in nano-wire 26. The simulated result of the stress is shown as line 170 in FIG. 7, wherein the compressive stress in nano-wire 26 is illustrated as a function of the distance D1 (FIG. 6) from the bottom of semiconductor cap 164. The results also indicated that the compressive stress may be as high as −8 G Pascal, and the stress may remain high when distance D1 is smaller than about 0.02 μm. This means that the high compress stress may be formed in the channel of the vertical PMOS transistor as long as the distance of the channel from the bottom of semiconductor cap 164 is smaller than about 0.02 μm. Furthermore, line 170 is simulated with low-viscosity layer 38 (FIG. 6) surrounding nano-wire 26. If low-viscosity layer 38 is replaced by silicon oxide, then the respective result is shown as line 172. Compared to line 170, line 172 drops much faster than line 170 when distance D1 increases. This means that it is more difficult to generate a high compressive stress in channel if low-viscosity layer 38 is not formed, unless the channel is formed very close to the bottom of semiconductor cap 164.

In accordance with some embodiments, the generated stress may be concentrated in the channel region by adopting a semiconductor material that has a low Young's modulus to form the channel region. For example, as shown in FIGS. 1Q, 2G, and 3G, the channel region may include portion 26C formed of substantially pure germanium or silicon germanium. The overlying portion 26A and underlying portion 26B of nano-wire 26 may be formed of silicon with no germanium comprised therein, or may be formed of silicon germanium, with the germanium concentration lower than in portion 26C.

Figure 8:
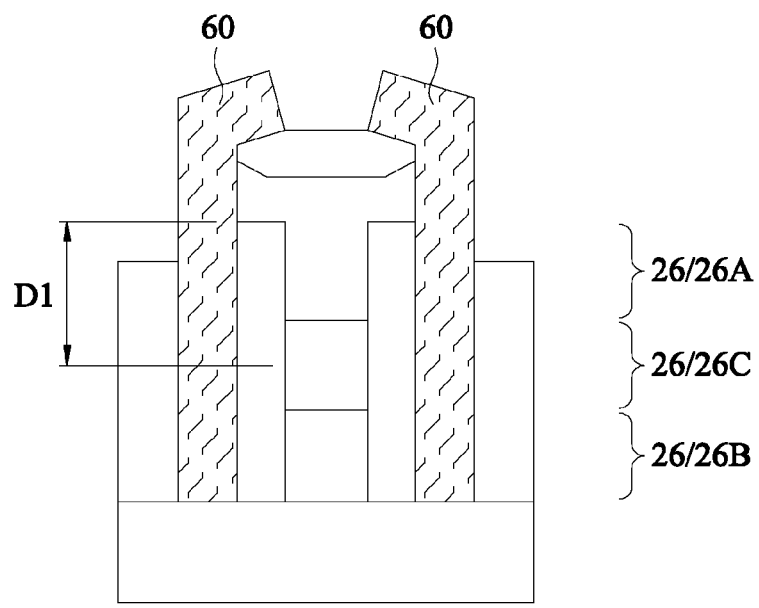
FIG. 8 illustrates stresses in a vertical transistor, which includes a germanium channel between two silicon regions.
Figure 9:
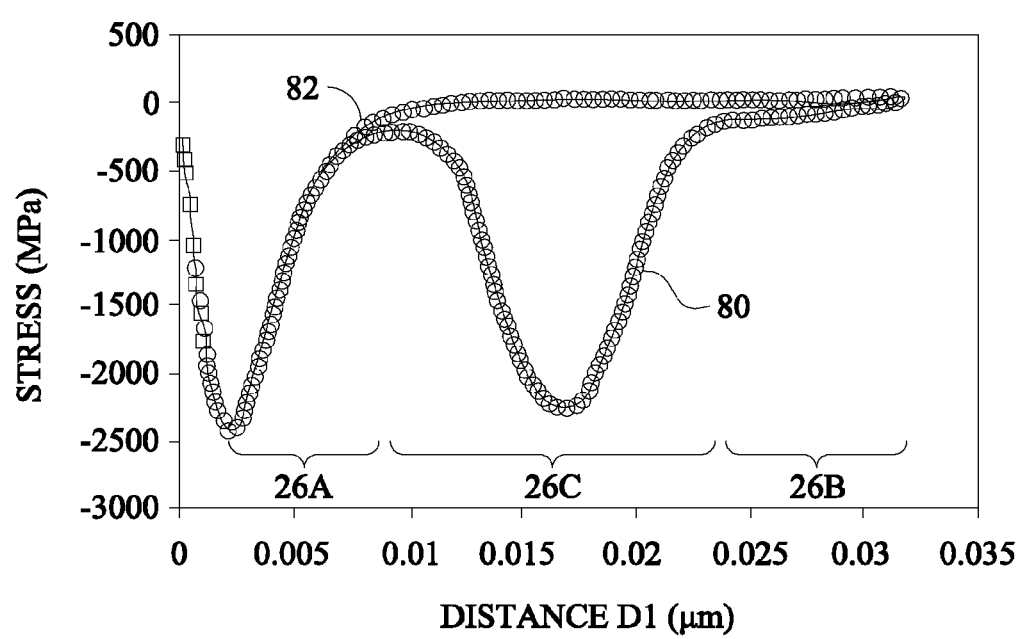
FIG. 9 illustrates the simulated stress in the vertical transistor shown in FIG. 8.

FIG. 8 illustrates a structure for simulating the concentration of the compressive stresses, wherein nano-wire portions 26A and 26B are silicon nano-wire portions, and portion 26C is a germanium nano-wire portion. The simulated stress is shown in FIG. 9. It is shown by line 80 that the stress in portion 26C is significantly greater than in neighboring portions 26A and 26B. As a comparison, if portions 26A, 26B, and 26C are all formed of silicon, then the simulated stress will be shown as line 82, which shows that the compressive stress in portion 26C is not greater than in portions 26A and 26B.

FIGS. 10A, 10B, 10C, and 10D illustrate a perspective view, a top view, and cross-sectional views of vertical nano-wire transistors in accordance with some exemplary embodiments. Unless specified otherwise, the materials and the formation methods of the components in these embodiments are essentially the same as the like components, which are denoted by like reference numerals in the embodiments shown in FIGS. 1A through 1Q. The details regarding the formation process and the materials of the components shown in FIGS. 10A through 15 may thus be found in the discussion of the embodiments shown in FIGS. 1A through 1Q.

Figure 10A:
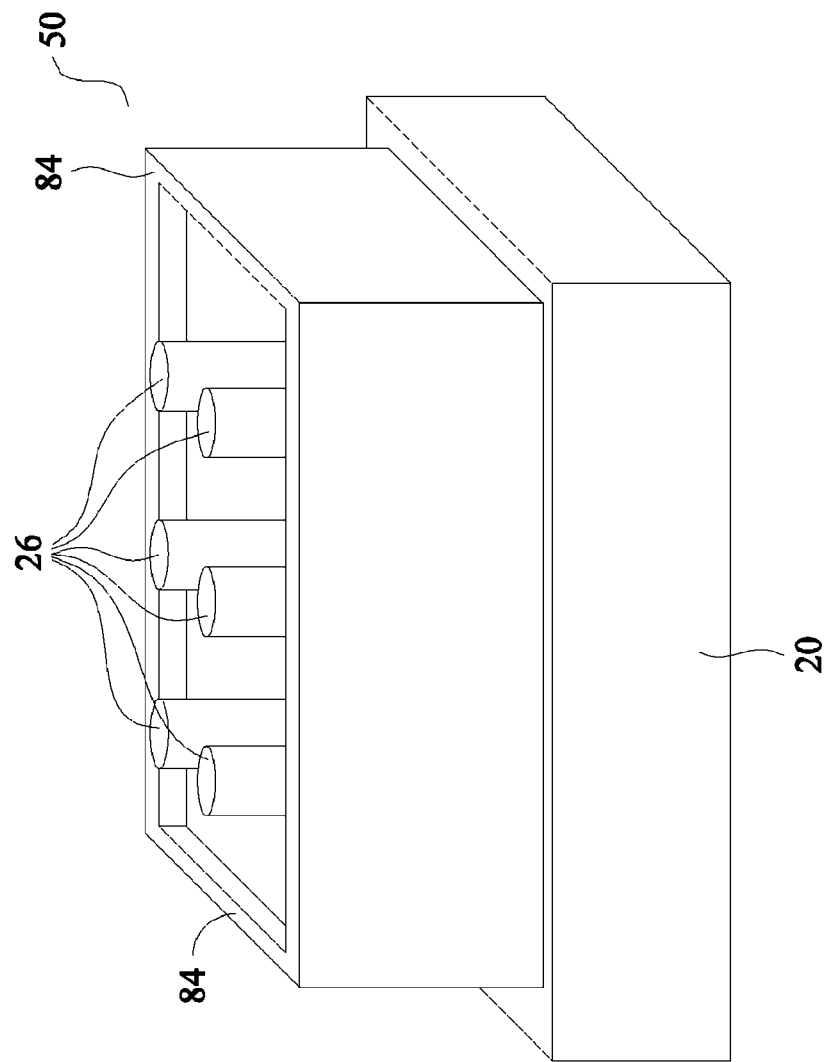
FIGS. 10A, 10B, 10C, and 10D illustrate a perspective view, a top view, and cross-sectional views of a vertical nano-wire transistor in accordance with some embodiments.

FIG. 10A illustrates the perspective view of vertical nano-wire transistor 50 in accordance with some embodiments of the present disclosure. A plurality of nano-wires 26 is formed close to each other and forms a nano-wire group. In accordance with some embodiments of the present disclosure, nano-wires 26 are arranged as an array including one or a plurality of rows and one or a plurality of columns. The number of rows and the number of columns may be in the range between 1 and about 5, for example. The plurality of nano-wires 26 may also be laid out in other patterns other than arrays. For example, the plurality of nano-wires 26 may be laid out as a hexagonal pattern. Some of the features of vertical nano-wire transistor 50 such as the gate dielectric, the gate electrode, the contact plugs, or the like, is not shown in FIG. 10A, and may be found in cross-sectional views.

Nano-wires 26 form a plurality of vertical nano-wire transistors, with each of nano-wires 26 forming a vertical nano-wire transistor with the respective gate dielectric 32 and gate electrode 34 (not shown in FIG. 10A, refer to FIGS. 11-14). The source regions (one of source/drain regions 22 and 48 (FIGS. 11-14) of the plurality of vertical nano-wire transistors are interconnected to form a common source. The drain regions (the other ones of source/drain regions 22 and 48 (FIGS. 11-14) of the plurality of vertical nano-wire transistors are interconnected to form a common drain. The plurality of vertical nano-wire transistors also shares a common gate electrode 34 (FIGS. 11-14). Accordingly, the plurality of vertical nano-wire transistors in combination acts as a single vertical nano-wire transistor, which is also denoted using reference notation 50.

In accordance with some embodiments, strain-applying layer 84 is formed as a ring encircling the region of nano-wire transistor 50. Strain-applying layer 84 is used to apply a desirable strain to the selected regions of vertical nano-wire transistor 50. In accordance with some embodiments of the present disclosure, strain-applying layer 84 applies a compressive strain to nano-wires 26. For example, the compressive strain may be applied when the respective nano-wire transistor 50 is a PMOS transistor. In accordance with alternative embodiments of the present disclosure, strain-applying layer 84 applies a tensile strain to nano-wires 26. For example, the tensile strain may be applied when the respective nano-wire transistor 50 is an NMOS transistor.

Figure 10B:
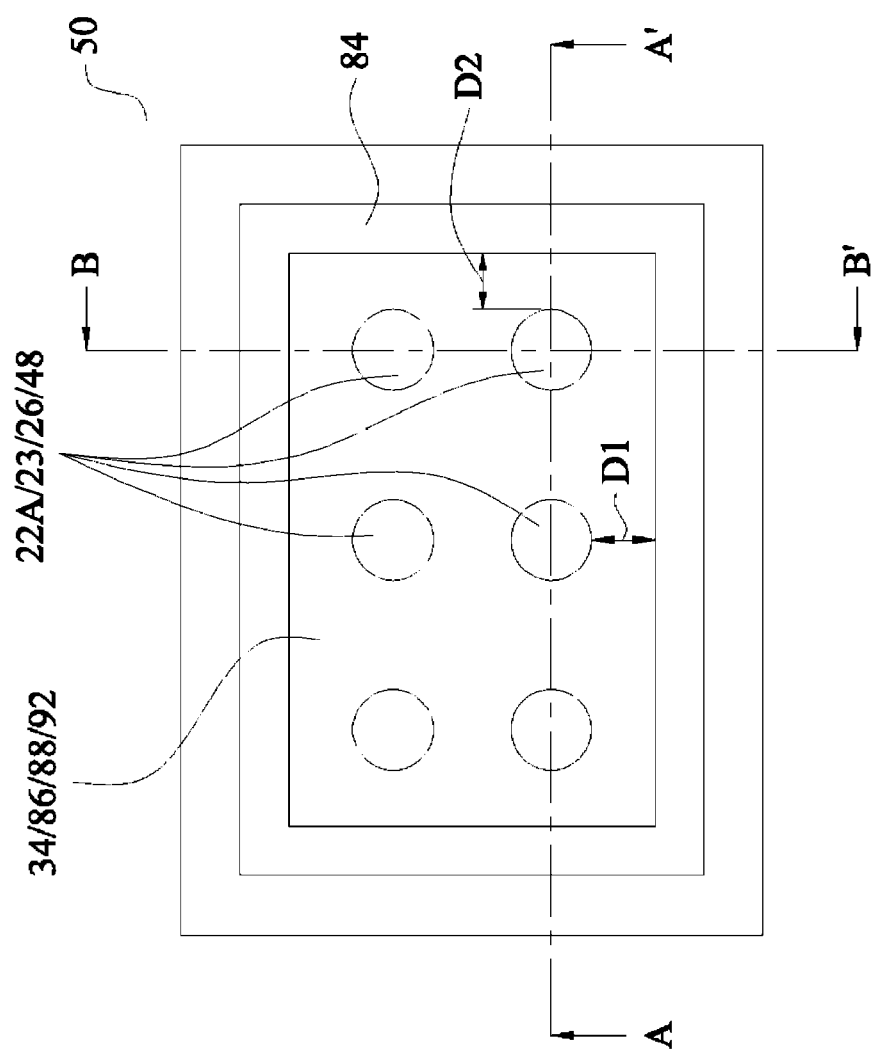

FIG. 10B illustrates a top view of some features of vertical nano-wire transistor 50. The plurality of nano-wires 26 is illustrated as forming an array in some exemplary embodiments. The top-view may be obtained from the level of the top source/drain region 48 (refer to FIG. 10C), wherein the illustrated portions of nano-wires 26 are the top source/drain portions of nano-wires 26. The top-view may also be obtained from the level of the channel region 23, wherein the illustrated portions of nano-wires 26 are the channel regions 23 of nano-wires 26. The top-view may also be obtained from the level of the bottom source/drain region, wherein the illustrated portions of nano-wires 26 are the bottom source/drain regions 22A of nano-wires 26. As shown in FIG. 10B. Strain-applying layer 84 may form a full ring encircling nano-wires 26. In some exemplary embodiments, top source/drain regions 48 are drain regions, and bottom source/drain regions 22A are source regions. In accordance with alternative embodiments, top source/drain regions 48 are source regions, and bottom source/drain regions 22A are drain regions.

Strain-applying layer 84 may be formed of a dielectric material, which may be an oxide (such as silicon oxide), a nitride (such as silicon nitride), an oxynitride (such as silicon oxynitride), a carbide (such as silicon carbide), or multi-layers thereof. The formation process is tuned to generate a desirable strain in strain-applying layer 84, so that strain-applying layer 84 may apply a desirable strain to nano-wires 26.

To maximize the strain-applying effect, strain-applying layer 84 is formed to be close to nano-wires 26. In some exemplary embodiments, distances D1 and D2 between strain-applying layer 84 and the closest ones of nano-wires 26 are smaller than about 15 nm. Distances D1 and D2 may also be in the range between about 5 nm and about 10 nm. Also, the top view shape of strain-applying layer 84 may be a rectangle, a circle, an ellipse, a hexagon, or the like, wherein the top view shape of strain-applying layer 84 may be selected depending on the arrangement of nano-wires 26, so that the distances between strain-applying layer 84 and nano-wires 26 are minimized, providing the design rules are not violated.

Figure 10C:
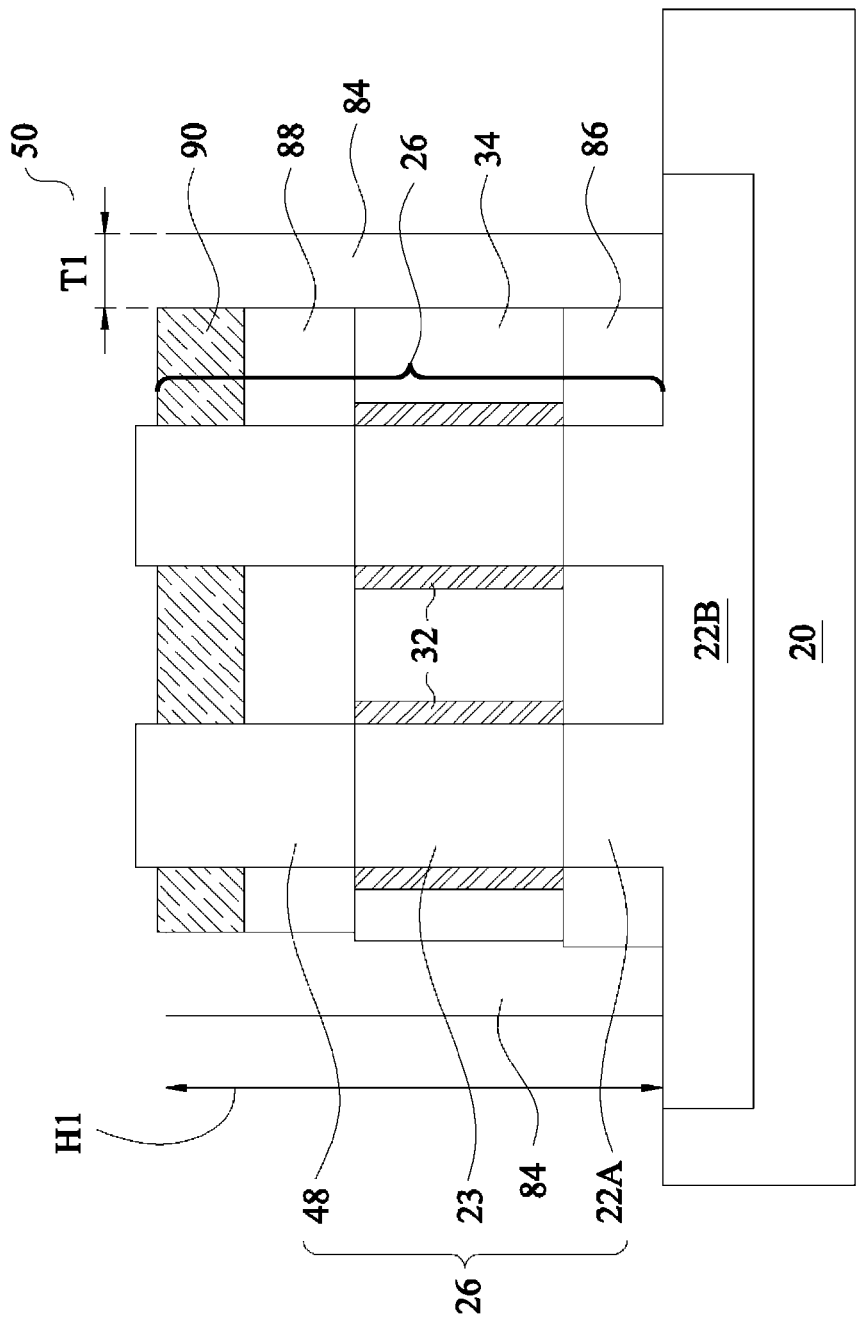

FIG. 10C is a cross-sectional view of vertical nano-wire transistor 50, wherein the cross-sectional view is obtained from the plane containing B-B' in FIG. 10B. As shown in FIG. 10C, each of nano-wires 26 includes a bottom portion 22A, which is a part of bottom source/drain region 22. Each of nano-wires 26 includes a middle portion 23 forming the channel region of the respective vertical nano-wire transistor 50. Each of nano-wires 26 further includes a top portion 48 forming the top source/drain region of vertical nano-wire transistor 50. Gate dielectrics 32 encircle channel regions 23.

Bottom dielectric layer 86, which is also referred to as a bottom Inter-Layer Dielectric (ILD), is formed to encircle the nano-wire portions 22A of bottom source/drain region 22. Gate electrode 34 is formed over bottom ILD 86 and encircling each of gate dielectrics 32. Top dielectric layer 88, which is also referred to as a top ILD, is formed to encircle top source/drain regions 48, which may also be parts of nano-wires 26.

In addition, hard top layer 90 may be formed over top ILD 88. In accordance with some embodiments of the present disclosure, hard top layer 90 is a conductive layer, and may be formed of doped silicon (for example, doped polysilicon or doped silicon grown epitaxially on top of the nanowires) or silicide. Hard top layer 90 may electrically inter-couple the individual top source/drain regions 48 to form a common top source/drain region.

Strain-applying layer 84 encircles, and hence includes portions on opposite sides of, the entire region including nano-wires 26, bottom ILD 86, gate dielectrics 32, gate electrode 34, top ILD 88, and hard top layer 90 therein. Furthermore, strain-applying layer 84 may be in physical contact with the sidewalls of bottom ILD 86, gate electrode 34, top ILD 88, and hard top layer 90. The bottom source/drain region 22 may include an embedded portion 22B in semiconductor substrate 20, wherein the embedded portion 22B electrically inter-couples the individual bottom source/drain nano-wire portions 22A to form a common bottom source/drain region. Embedded portion 22B may laterally extend beyond the outer edges of strain-applying layer 84 in accordance with some embodiments. In alternative embodiments, embedded portion 22B is limited in the region directly under the region encircled by strain-applying layer 84.

In accordance with some embodiments of the present disclosure, strain-applying layer 84 extends to semiconductor substrate 20, and may be in contact with the embedded source/drain region 22B, which is a part of semiconductor substrate 20 in some embodiments. Strain-applying layer 84 may or may not include some horizontal portions (not shown) connected to the bottom end of the illustrated vertical strain-applying layer 84 and extending outwardly. Strain-applying layer 84 may be formed as a conformal layer, wherein its height H1 is significantly greater than, for example, five times or greater its thickness T1.

Figure 10D:
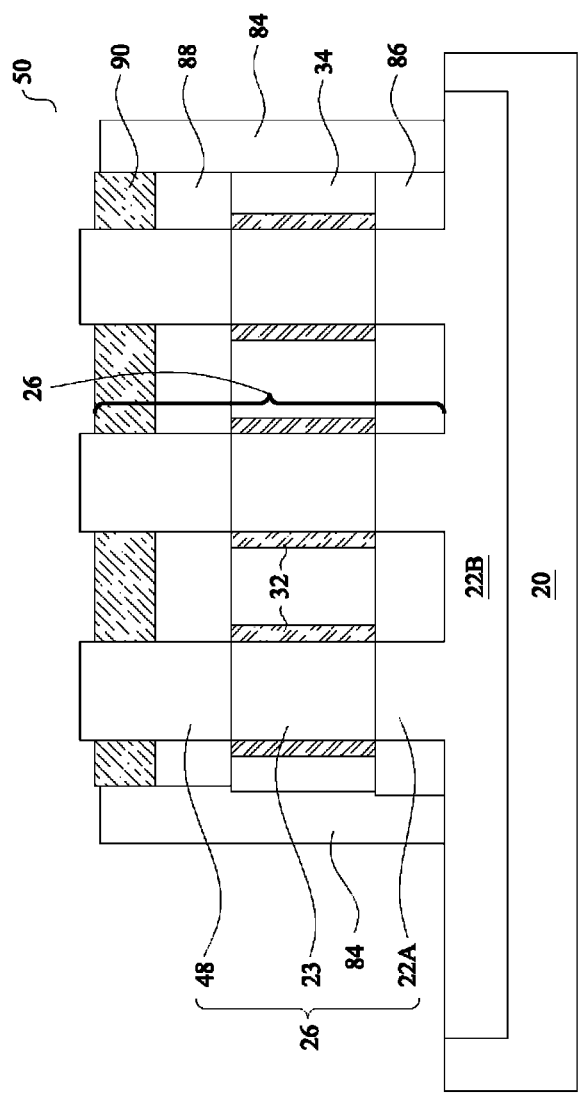
Figure 14:
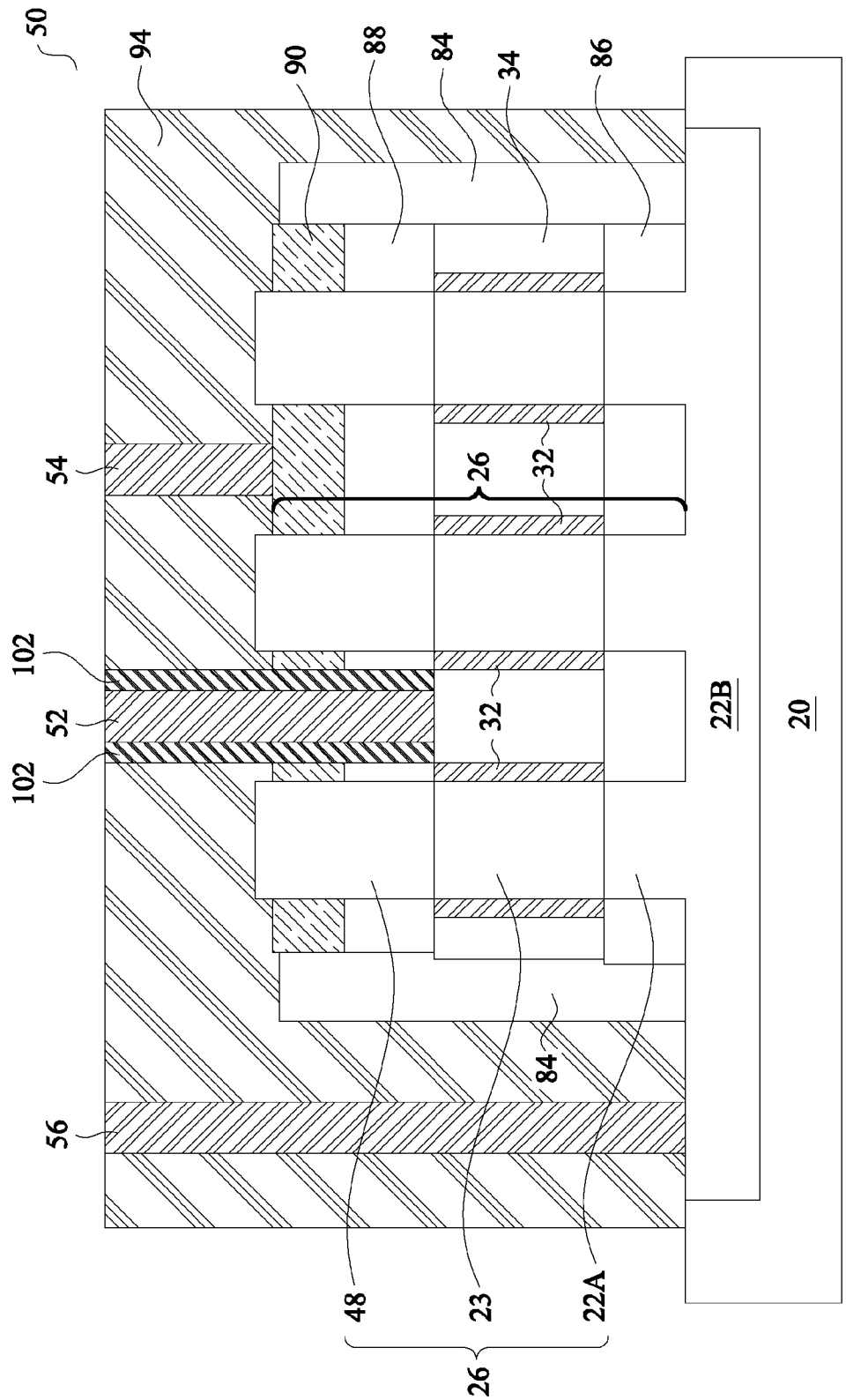
FIG. 14 illustrates a cross-sectional view of a vertical nano-wire transistor in accordance with some embodiments, wherein contact plugs are shown.

FIG. 10D is a cross-sectional view of vertical nano-wire transistor 50, wherein the cross-sectional view is obtained from the plane containing A-A' in FIG. 10B. This cross-sectional view is similar to the cross-sectional view shown in FIG. 10C, except that more nano-wires 26 are illustrated. In addition, FIG. 10D illustrates that embedded portion 22B may extend out of the outer edge of strain-applying layer 84 far enough in one direction (toward left, for example), so that embedded portion 22B may be used to connect to a source/drain contact plug (as shown in FIG. 14).

Figure 11:
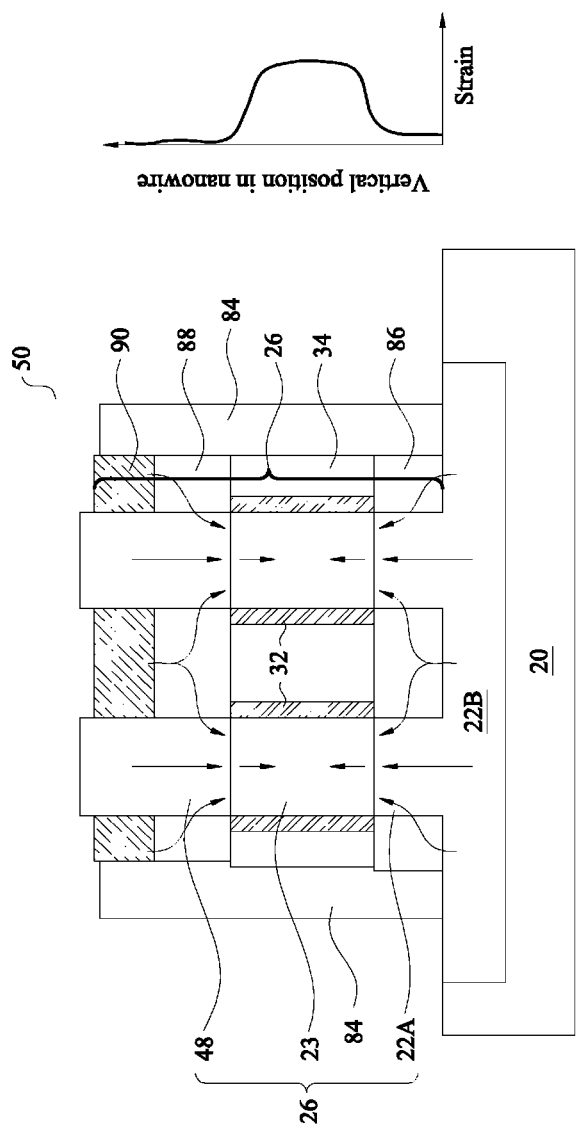
FIG. 11 illustrates a cross-sectional view of a vertical nano-wire transistor having a soft gate electrode in accordance with some embodiments.
Figure 12:
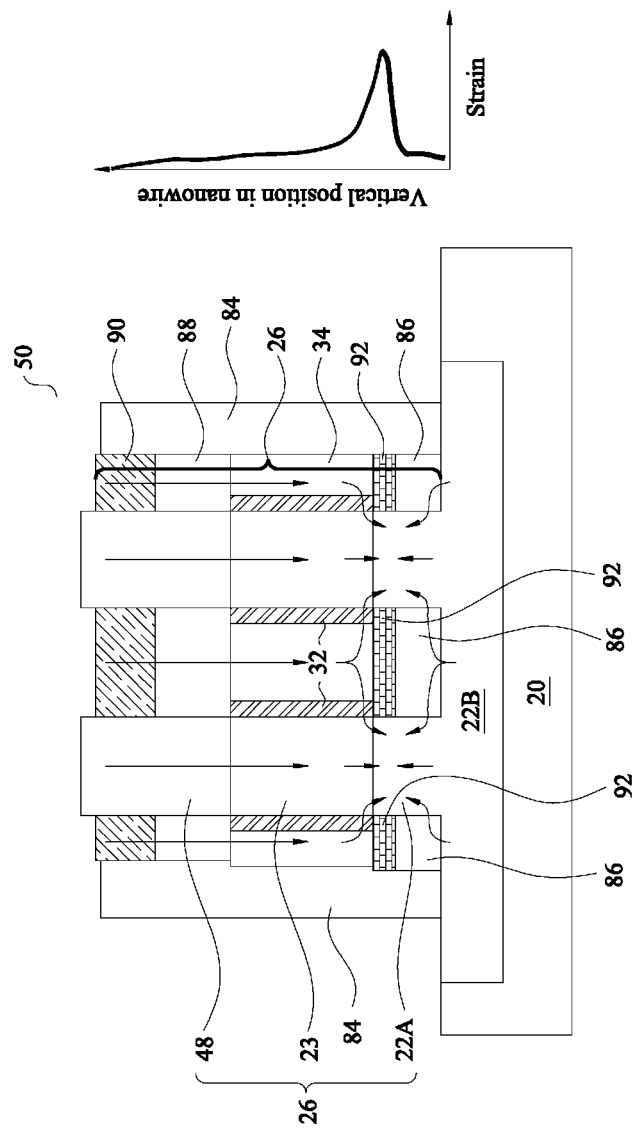
FIG. 12 illustrates a cross-sectional view of a vertical nano-wire transistor having a soft dielectric layer under a gate electrode in accordance with some embodiments.
Figure 13:
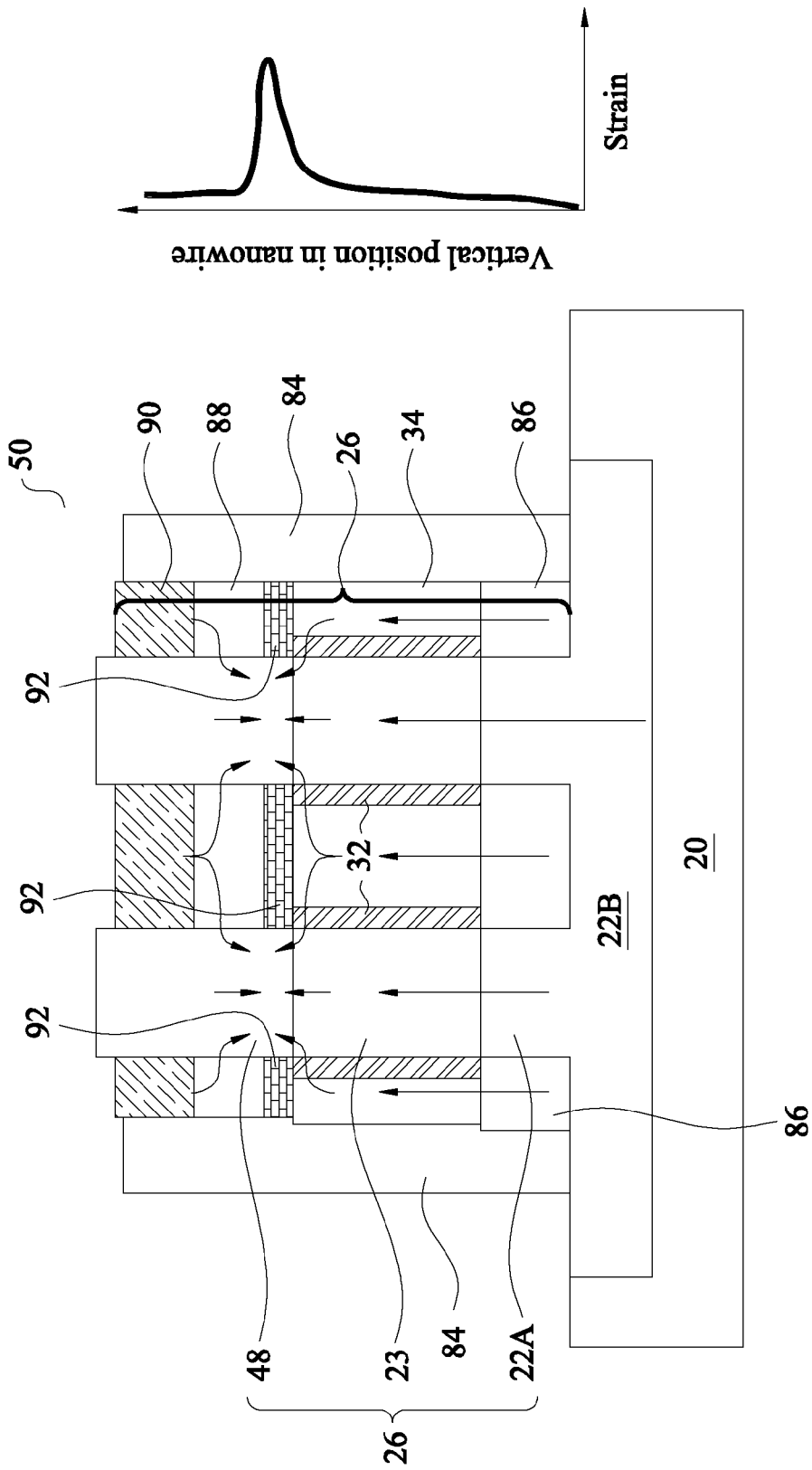
FIG. 13 illustrates a cross-sectional view of a vertical nano-wire transistor having a soft dielectric layer over a gate electrode in accordance with some embodiments.

FIGS. 11, 12, and 13 illustrate the cross-sectional views of vertical nano-wire transistor 50 in accordance with various exemplary embodiments, wherein the strains are concentrated to different parts of nano-wires 26. In the following discussion, compressive strains are used as examples to explain the concept of the present disclosure. The corresponding vertical nano-wire transistor 50 is accordingly a PMOS device. It is appreciated that tensile strains may also be applied by in accordance with other embodiments, wherein the strain applied by strain-applying layer 84 is a tensile strain. The corresponding vertical nano-wire transistor 50 is accordingly an NMOS device.

FIG. 11 schematically illustrates some embodiments in which the strain is concentrated to channel regions 23. Referring to FIG. 11, nano-wires 26, which includes portions 22A, 23, and 48, are formed of materials having first Young's moduli, which are relatively high. Alternatively stated, nano-wires 26 are formed of relatively hard materials. It is realized that the modulus of a material may be affected by its size. For example, bulk silicon has a high Young's modulus equal to about 180 GPa. When formed as nano-wires rather than bulk regions, the Young's modulus of silicon is reduced, sometimes to as low as about 80 GPa. Accordingly, when selecting appropriate materials to form the nano-wires, the factors such as the sizes need to be taken into consideration in order to obtain the desirable modulus.

Gate electrode 34 is selected to have a second Young's modulus. In accordance with some embodiments, the second Young's modulus is smaller than the first Young's moduli of nano-wires 26. In accordance with alternative embodiments, the second Young's modulus is equal to or greater than the first Young's moduli of nano-wires 26. Gate electrode 34 is formed of a conductive material. In some exemplary embodiments, gate electrode 34 is formed of aluminum, which has a Young's modulus equal to about 69 GPa. Top ILD 88 and bottom ILD 86 are formed of materials having third Young's moduli greater than the Young's modulus of gate electrode 34. Accordingly, with strain-applying layer 84 applying a strain (compressive or tensile), the strain is eventually imparted to nano-wires 26. Furthermore, with gate electrode 34 being softer than the overlying ILD 88 and underlying ILD 86, the strain is concentrated to channel regions 23. The arrows in FIG. 11 schematically illustrate how the strain is concentrated.

In addition, to maximize the strain in channel regions 23, the first Young's moduli of nano-wires 26 may also be greater than the Young's moduli of both top ILD 88 and bottom ILD 86 and the Young's modulus of gate electrode 34, so that the strain is concentrated to nano-wires 26, rather than to top ILD 88 and bottom ILD 86, and gate electrode 34.

In accordance with some exemplary embodiments, the Young's modulus of gate electrode 34 is smaller than the Young's moduli of both top ILD 88 and bottom ILD 86 by about 5 GPa or greater, so that the strain may be effectively concentrated to channel regions 23. Furthermore, the Young's modulus of gate electrode 34 may be smaller than about 80 percent, or smaller than about 50 percent, of the Young's moduli of both top ILD 88 and bottom ILD 86. The Young's modulus of gate electrode 34 may be between about 20 percent and about 80 percent of the Young's moduli of both top ILD 88 and bottom ILD 86. It is appreciated that the Young's modulus of a material is affected by various factors such as the material itself, the porosity, the forming conditions (such as the temperatures), the sizes, etc. Accordingly, same materials may not have the same Young's moduli.

As shown in FIG. 11, when vertical nano-wire transistor 50 is a PMOS transistor, strain-applying layer 84 is configured to apply a compressive strain to the regions encircled by strain-applying layer 84. The compressive strain is concentrated to channel regions 23, and hence the hole mobility in channel regions 23 is improved. In alternative embodiments when vertical nano-wire transistor 50 is an NMOS transistor, strain-applying layer 84 is configured to apply a tensile strain to the regions encircled by strain-applying layer 84. The tensile strain is also concentrated to channel regions 23, and hence the electron mobility in the channel regions 23 is improved.

FIG. 11 also schematically illustrates simulation results revealing the strain distribution in nano-wires 26, wherein the simulation results are shown on the right side of the cross-sectional view. The X axis represents the magnitude of the strain, and the Y axis represents the vertical position in nano-wires 26. The simulation results indicate that the strain has greater magnitudes at the positions corresponding to the channel regions than at the positions corresponding to the source/drain regions 22A and 48, indicating that the strain is concentrated to the channel regions 23, wherein the source/drain portions 22A and 48 of nano-wires have much smaller strains.

FIG. 12 schematically illustrates some embodiments in which the strain is concentrated to the bottom source/drain junction regions, which are the regions close to the interfaces between channel regions 23 and the respective underlying source/drain portions 22A. In these embodiments, dielectric layer 92 is formed between bottom ILD 86 and gate electrode 34. Dielectric layer 92 is formed of a relatively soft material softer than ILDs 86 and 88 and gate electrode 34. Alternatively stated, the Young's modulus of dielectric layer 92 is smaller than the Young's moduli of bottom ILD 86, top ILD 88, and gate electrode 34. The Young's modulus of dielectric layer 92 may also be smaller than the Young's modulus of hard top layer 90. In some exemplary embodiments, the Young's modulus of dielectric layer 92 may be lower than 80 percent, or between about 20 percent and about 80 percent, of the Young's moduli of bottom ILD 86, top ILD 88, and gate electrode 34 to effectively concentrate the strain.

The top surface of dielectric layer 92 may be in contact with the bottom surface of gate electrode 34, and may be substantially level with the interface between channel regions 23 and the respective underlying source/drain portions 22A. Dielectric layer 92 may act as the gate spacer of the respective vertical nano-wire transistor 50. Dielectric layer 92 may extend to contact strain-applying layer 84 in all lateral directions. The candidate materials of dielectric layer 92 include and are not limited to Boron-Doped Phospho-Silicate Glass (BPSG), Phospho-Silicate glass (PSG), and Boro-Silicate Glass (BSG). The thickness of dielectric layer 92 may be greater than about 5 nm, or greater than about 10 nm.

Since dielectric layer 92 is softer than bottom ILD 86, top ILD 88, gate electrode 34, and hard top layer 90, strain is concentrated to the bottom junction regions, which are parts of the nano-wires 26 close to the junction between channel regions 23 and bottom source/drain regions 22A. The arrows in FIG. 12 schematically illustrate how the strain is concentrated. FIG. 12 also schematically illustrates simulation results (on the right side of the cross-sectional view) revealing the strain distribution in nano-wires 26. The X axis represents the magnitude of the strain, and the Y axis represents the vertical position in nano-wires 26. The simulation results indicate that the strain is concentrated to the bottom junction regions, wherein the rest portions of nano-wires 26 have much smaller strain.

The concentration of the strain to the bottom junction regions advantageously results in the enhancement of the performance of vertical nano-wire transistor 50. For example, if the bottom source/drain regions 22A are source regions, the carrier injection velocity will be enhanced. On the other hand, if the bottom source/drain regions 22A are drain regions, the peak carrier velocity will be enhanced.

FIG. 13 schematically illustrates some embodiments in which strain is concentrated to the top source/drain junction regions, which are the regions close to the interfaces between channel regions 23 and the respective overlying source/drain regions 48. These embodiments are similar to the embodiments shown in FIG. 12, except that soft dielectric layer 92 is between top ILD 88 and gate electrode 34.

In these embodiments, the bottom surface of dielectric layer 92 may be in contact with the top surface of gate electrode 34. Dielectric layer 92 may also act as a gate spacer. Since dielectric layer 92 is softer than bottom ILD 86, top ILD 88, gate electrode 34, and hard top layer 90, strain is concentrated to the top junction regions of nano-wires 26. The arrows in FIG. 13 schematically illustrate how the strain is concentrated. FIG. 13 also schematically illustrates simulation results revealing the strain distribution in nano-wires 26. The X axis represents the magnitude of the strain, and the Y axis represents the vertical position in nano-wires 26. The simulation results indicate that the strain is concentrated to the top junction regions, wherein the rest portions of nano-wires 26 have much smaller strain.

The concentration of the strain to the top junction regions also advantageously results in the enhancement of the performance of vertical nano-wire transistor 50. For example, if the top source/drain regions 48 are source regions, the carrier injection velocity will be enhanced. On the other hand, if the top source/drain regions 48 are drain regions, the peak carrier velocity will be enhanced.

FIG. 14 illustrates a cross-sectional view of vertical nano-wire transistor 50, wherein contact plugs 56, 52, and 54 are illustrated. The cross-sectional view is obtained from the plane containing line A-A' in FIG. 10B. ILD 94 is formed to encircle strain-applying layer 84, and may extend to a level over the top surfaces of top source/drain regions 48 and hard top layer 90. ILD 94 may be formed of a homogenous dielectric material, or may have a composite structure including a plurality of layers. Source/drain contact plug 56 penetrates through ILD 94 to electrically couple to bottom source/drain region 22B. Source/drain contact plug 54 penetrates through ILD 94 to electrically couple to conductive top hard layer 90, and hence electrically couple to top source/drain region 48. Gate contact plug 54 penetrates through ILD 94 to electrically couple to gate electrode 34. Dielectric layer 102 is formed to electrically insulate gate contact plug 54 from hard top layer 90.

Figure 15:
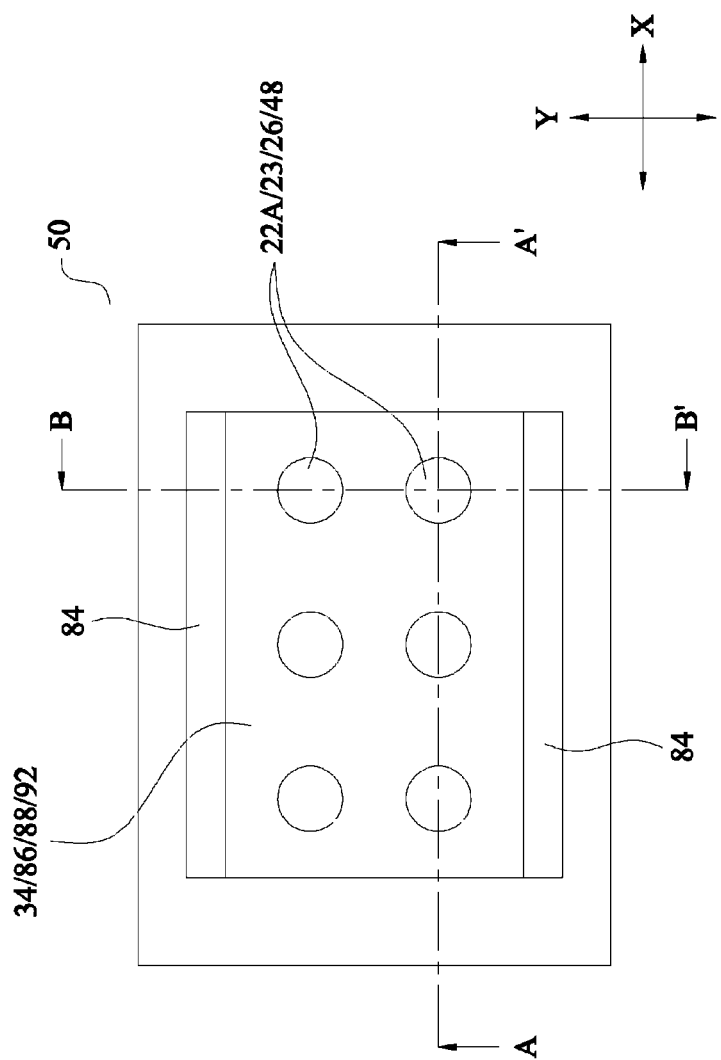
FIG. 15 illustrates a top view of a vertical nano-wire transistor in accordance with alternative embodiments.

FIG. 15 illustrates the top view of vertical nano-wire transistor 50 in accordance with yet alternative embodiments. These embodiments are similar to the embodiments shown in FIGS. 11, 12, and 13, except that strain-applying layer includes portions on the opposite sides of layers 34, 86, 88, and 90 in the Y direction, but not on the opposite sides of layers 34, 86, 88, and 90 in the X direction. Strain-applying layer 84 thus does not form a ring, as shown in FIG. 15. The cross-sectional view of vertical nano-wire transistor 50 in accordance with these embodiments may still be the same as shown in FIGS. 11, 12, and 13 when the cross-sectional view is obtained from the plane containing line B-B' in FIG. 15.

Figure 16:
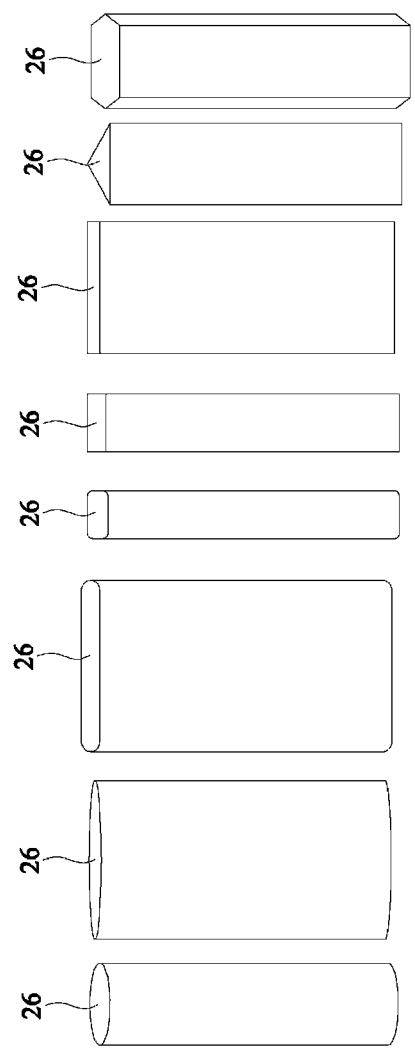
FIG. 16 schematically illustrates a plurality of usable shapes of nano-wires 26.

Although the term "nano-wire" is used to describe the vertical semiconductor features, the sizes of the "nano-wires 26" may be greater than typical nanometer range. In addition, the shapes of nano-wires 26 may adopt any applicable shapes. FIG. 16 schematically illustrates a plurality of usable shapes for nano-wires 26. For example, the top view shapes of nano-wires 26 include circles, ellipses, rectangles with rounded corners, rectangles with relatively sharp corners, long strips, triangles, hexagons, or the like.

The embodiments as shown in FIGS. 10A, 10B, 10C, 10D and 11-15 have some advantageous features. Strain may be applied to a plurality of nano-wires through a common strain-applying layer. The manufacturing process is thus significantly simplified. In addition, it is possible to customize the regions of the nano-wires to which the strain is concentrated.

In accordance with some embodiments of the present disclosure, a device includes a semiconductor substrate and a vertical nano-wire over the semiconductor substrate. The vertical nano-wire includes a bottom source/drain region, a channel region over the bottom source/drain region, and a top source/drain region over the channel region. A top ILD encircles the top source/drain region. The device further includes a bottom ILD encircling the bottom source/drain region, a gate electrode encircling the channel region, and a strain-applying layer having vertical portions on opposite sides of, and contacting opposite sidewalls of, the top ILD, the bottom ILD, and the gate electrode.

In accordance with alternative embodiments of the present disclosure, a device includes a semiconductor substrate, and a plurality of vertical nano-wires over the semiconductor substrate. Each of the plurality of vertical nano-wires includes a bottom source/drain region, a channel region over the bottom source/drain region, and a top source/drain region over the channel region. A top ILD encircles the top source/drain region of each of the plurality of vertical nano-wires. A bottom ILD encircles the bottom source/drain region of each of the plurality of vertical nano-wires. A gate electrode encircles the channel region of each of the plurality of vertical nano-wires. A strain-applying layer encircles and is in physical contact with sidewalls of the top ILD, the bottom ILD, and the gate electrode.

In accordance with yet alternative embodiments of the present disclosure, a device includes a semiconductor substrate, a vertical semiconductor nano-wire over the semiconductor substrate, and a stack of layers having four edges, wherein the stack of layers encircles the vertical semiconductor nano-wire. The stack of layers includes a bottom ILD over the semiconductor substrate, a gate electrode over the bottom ILD, and a top ILD over the gate electrode, with the bottom ILD, the gate electrode, and the top ILD being co-terminus. A strain-applying layer extends from a first level of a bottom of the nano-wire to a second level of a top surface of the nano-wire. The strain-applying layer has a height and a thickness smaller than the height. The four edges of the stack of layers contact sidewalls of the strain-applying layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
a vertical nano-wire over the semiconductor substrate, the vertical nano-wire comprising:
 a bottom source/drain region;
 a channel region over the bottom source/drain region; and
 a top source/drain region over the channel region;
a top Inter-Layer Dielectric (ILD) encircling the top source/drain region;
a bottom ILD encircling the bottom source/drain region;
a gate electrode encircling the channel region; and
a strain-applying layer comprising vertical portions on opposite sides of, and contacting opposite sidewalls of, the top ILD, the bottom ILD, and the gate electrode.

2. The device of claim 1, wherein the strain-applying layer forms a fully ring encircling the top ILD, the bottom ILD, and the gate electrode.

3. The device of claim 2 further comprising a plurality of vertical nano-wires comprising the vertical nano-wire, wherein the full ring encircles the plurality of vertical nano-wires.

4. The device of claim 1, wherein at least one of the top ILD, the bottom ILD, and the gate electrode extend in all lateral directions to contact the strain-applying layer.

5. The device of claim 1, wherein the gate electrode has a Young's modulus lower than Young's moduli of the top ILD and the bottom ILD and vertical nano-wire.

6. The device of claim 1 further comprising an additional dielectric layer between the bottom ILD and the gate electrode, wherein the additional dielectric layer has a Young's modulus lower than Young's moduli of the top ILD, the bottom ILD, the vertical nano-wire and the gate electrode.

7. The device of claim 1 further comprising an additional dielectric layer between the top ILD and the gate electrode, wherein the additional dielectric layer has a Young's modulus lower than Young's moduli of the top ILD, the bottom ILD, the vertical nano-wire and the gate electrode.

8. The device of claim 1 further comprising a top hard layer over the top ILD and encircling the top source/drain region, wherein the vertical portions of the strain-applying layer are further in contact with opposite sidewalls of the top hard layer.

9. A device comprising:
a semiconductor substrate;
a plurality of vertical nano-wires over the semiconductor substrate, with each of the plurality of vertical nano-wires comprising:
 a bottom source/drain region;
 a channel region over the bottom source/drain region; and
 a top source/drain region over the channel region;
a top Inter-Layer Dielectric (ILD) encircling the top source/drain region of each of the plurality of vertical nano-wires;
a bottom ILD encircling the bottom source/drain region of each of the plurality of vertical nano-wires;
a gate electrode encircling the channel region of each of the plurality of vertical nano-wires; and
a strain-applying layer encircling and in physical contact with sidewalls of the top ILD, the bottom ILD, and the gate electrode.

10. The device of claim 9, wherein the strain-applying layer has a top end higher than a top surface of the top ILD, and a bottom end lower than a bottom surface of the channel region.

11. The device of claim 9, wherein the strain-applying layer is configured to apply a tensile strain to the plurality of vertical nano-wires.

12. The device of claim 9, wherein the strain-applying layer is configured to apply a compressive strain to the plurality of vertical nano-wires.

13. The device of claim 9 further comprising a top conductive layer over the top ILD, wherein the top conductive layer encircles, and is in physical contact with, the top source/drain regions of the plurality of nano-wires, wherein a top end of the strain-applying layer is substantially level with a top surface of the top conductive layer.

14. The device of claim 9, wherein a bottom end of the strain-applying layer contacts a top surface of the semiconductor substrate.

15. The device of claim 9, wherein the gate electrode has a Young's modulus lower than Young's moduli of the top ILD and the bottom ILD and the plurality of vertical nano-wires.

16. The device of claim 9 further comprising an additional dielectric layer spacing one of the top ILD and the bottom ILD from the gate electrode, wherein the additional dielectric layer has a Young's modulus lower than Young's moduli of the top ILD, the bottom ILD, the plurality of vertical nano-wires and the gate electrode.

17. A device comprising:
a semiconductor substrate;
a vertical semiconductor nano-wire over the semiconductor substrate;
a stack of layers comprising four edges, wherein the stack of layers encircles the vertical semiconductor nano-wire and comprises:
 a bottom Inter-Layer Dielectric (ILD) over the semiconductor substrate;
 a gate electrode over the bottom ILD; and a top ILD over the gate electrode, with the bottom ILD, the gate electrode, and the top ILD being co-terminus; and a strain-applying layer extending from a first level of a bottom of the vertical semiconductor nano-wire to a second level of a top surface of the vertical semiconductor nano-wire, wherein the strain-applying layer has a height and a thickness smaller than the height, wherein the four edges of the stack of layers contact sidewalls of the strain-applying layer.

18. The device of claim 17, wherein the strain-applying layer forms a full ring encircling the stack of layers.

19. The device of claim 17, wherein the stack of layers further comprises a conductive layer encircling and physically contacting a top portion of the vertical semiconductor nano-wire, with a top surface of the conductive layer substantially level with a top end of the strain-applying layer.

20. The device of claim 17, wherein the gate electrode has a Young's modulus lower than a Young's modulus of each of the bottom ILD, the vertical semiconductor nano-wire, and the top ILD.

* * * * *